United States Patent
Dogiamis et al.

(10) Patent No.: US 12,463,156 B2
(45) Date of Patent: Nov. 4, 2025

(54) PACKAGING ARCHITECTURES FOR SUB-TERAHERTZ RADIO FREQUENCY DEVICES

(71) Applicant: Intel Corporation, Santa Clara, CA (US)

(72) Inventors: Georgios Dogiamis, Chandler, AZ (US); Adel A. Elsherbini, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 704 days.

(21) Appl. No.: 17/523,655

(22) Filed: Nov. 10, 2021

(65) Prior Publication Data

US 2023/0144206 A1    May 11, 2023

(51) Int. Cl.
| | |
|---|---|
| *H01L 23/66* | (2006.01) |
| *H01L 23/538* | (2006.01) |
| *H01L 25/00* | (2006.01) |
| *H01L 25/065* | (2023.01) |
| *H01Q 1/22* | (2006.01) |
| *H01Q 9/04* | (2006.01) |

(52) U.S. Cl.
CPC .......... *H01L 23/66* (2013.01); *H01L 23/5384* (2013.01); *H01L 25/0652* (2013.01); *H01L 25/50* (2013.01); *H01Q 1/2283* (2013.01); *H01Q 9/0407* (2013.01)

(58) Field of Classification Search
CPC .. H01L 23/66; H01L 23/5384; H01L 25/0652
See application file for complete search history.

(56) References Cited

U.S. PATENT DOCUMENTS

| | | | | |
|---|---|---|---|---|
| 11,335,642 B2* | 5/2022 | Liff | ........................ | H01L 25/065 |
| 11,335,663 B2* | 5/2022 | Liff | ..................... | H01L 23/5386 |
| 11,417,605 B2* | 8/2022 | See | ........................ | H01Q 1/243 |
| 11,694,940 B1* | 7/2023 | Mathuriya | ............. | G06F 1/329 |
| | | | | 257/295 |
| 12,176,292 B2* | 12/2024 | Ganesan | ............. | H01L 23/5385 |
| 2014/0198013 A1 | 7/2014 | Saraswat et al. | | |

(Continued)

OTHER PUBLICATIONS

Benson, Keith, "Phased Array Beamforming ICs Simplify Antenna Design," Analog Devices, Analog Dialogue 53-01, Jan. 2019; 4 pages.

(Continued)

*Primary Examiner* — Thao P Le
(74) *Attorney, Agent, or Firm* — Akona IP PC

(57) ABSTRACT

A microelectronic assembly is provided comprising: a first IC die in a first layer comprising an array of radio frequency (RF) patch antennas on a side opposite to a second layer; a second IC die in the second layer between the first layer and a third layer; and a third IC die in the third layer. The first IC die comprises RF and analog circuitry, the first IC die is part of an array of IC dies having similar size and circuitry as the first IC die, the second layer and the third layer comprise a dielectric with through-dielectric vias (TDVs) therein surrounding the second IC die and the third IC die, respectively, and an interface between adjacent layers comprises interconnects having a pitch of 10 micrometers between adjacent interconnects.

20 Claims, 9 Drawing Sheets

(56) References Cited

U.S. PATENT DOCUMENTS

| | | | |
|---|---|---|---|
| 2015/0371960 A1* | 12/2015 | Yap | H01L 24/09 |
| | | | 257/664 |
| 2019/0288371 A1* | 9/2019 | Kamgaing | H01L 23/3128 |
| 2020/0091584 A1 | 3/2020 | Tezuka | |
| 2021/0105030 A1 | 4/2021 | Kawahata et al. | |
| 2021/0242896 A1 | 8/2021 | Kim et al. | |
| 2021/0280523 A1* | 9/2021 | We | H01L 23/562 |
| 2021/0280538 A1 | 9/2021 | Kaeding et al. | |
| 2021/0407979 A1* | 12/2021 | We | H01L 25/16 |
| 2022/0189850 A1* | 6/2022 | Liff | H01L 23/49816 |
| 2022/0399305 A1* | 12/2022 | Choi | H01L 25/0652 |
| 2022/0415808 A1* | 12/2022 | Chava | H01L 25/0655 |
| 2023/0074181 A1* | 3/2023 | Brun | H01L 23/5384 |
| 2023/0085411 A1* | 3/2023 | Paital | H01L 24/82 |
| | | | 257/621 |
| 2023/0088170 A1* | 3/2023 | Brun | H01L 25/50 |
| | | | 257/782 |
| 2023/0102167 A1* | 3/2023 | Popovic | H01L 23/49816 |
| | | | 257/777 |
| 2023/0369289 A1* | 11/2023 | Guo | H01L 23/49838 |
| 2023/0420413 A1* | 12/2023 | Nitsch | H01L 25/50 |
| 2024/0063120 A1* | 2/2024 | Elsherbini | H01L 23/5384 |
| 2024/0071933 A1* | 2/2024 | Marin | H01L 23/481 |
| 2025/0062278 A1* | 2/2025 | Suthram | H01L 23/5226 |
| 2025/0105222 A1* | 3/2025 | Duan | H01L 24/17 |

OTHER PUBLICATIONS

Watanabe, Atom O., et al., "A review of 5G Front-End Systems Package Integration," arXiv:2009.07208v1, Sep. 15, 2020; 15 pages.

* cited by examiner

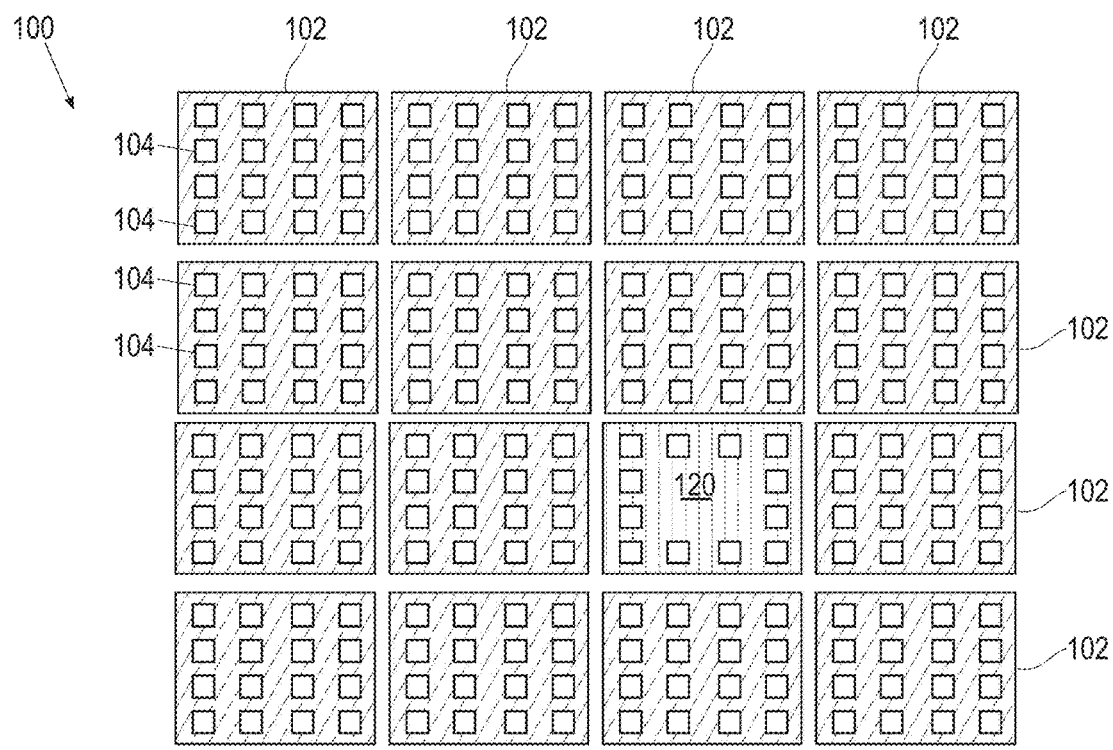
FIG. 1A
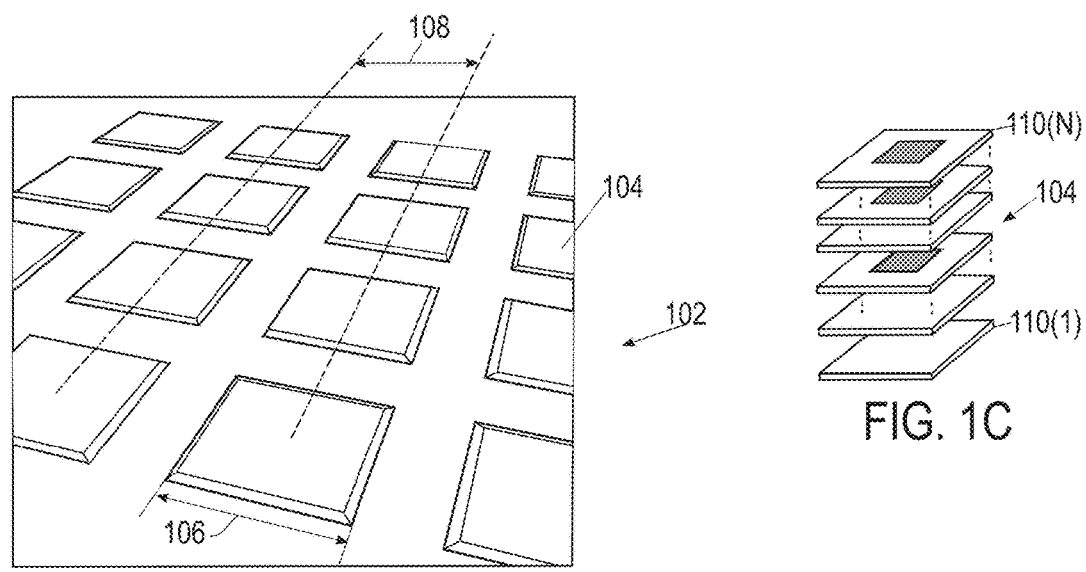
FIG. 1B
FIG. 1C

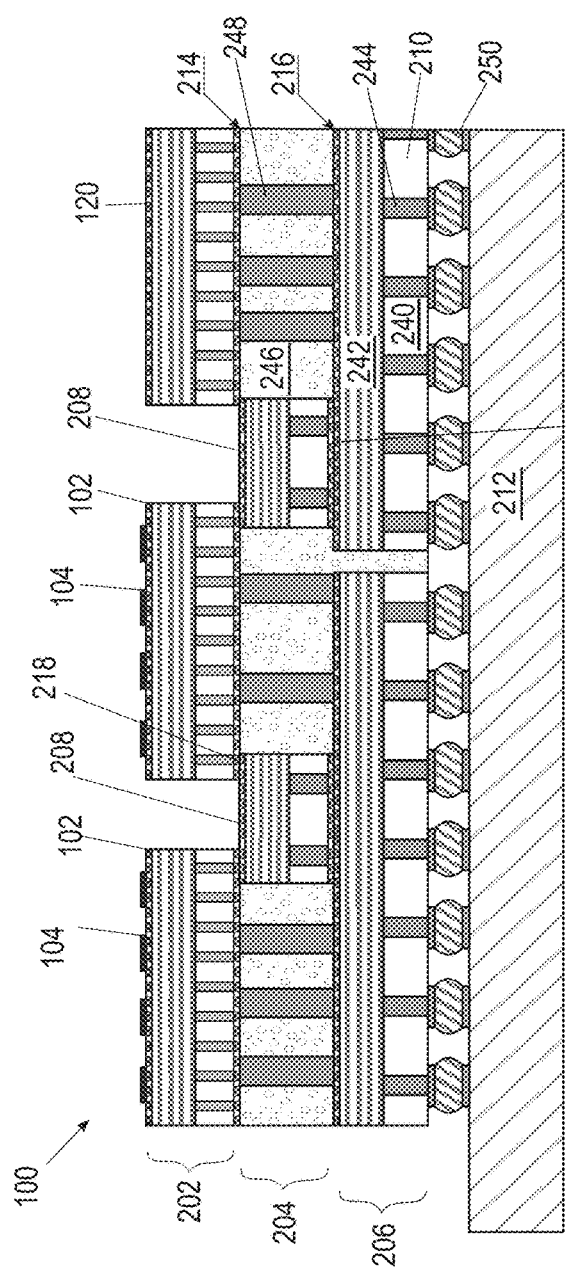
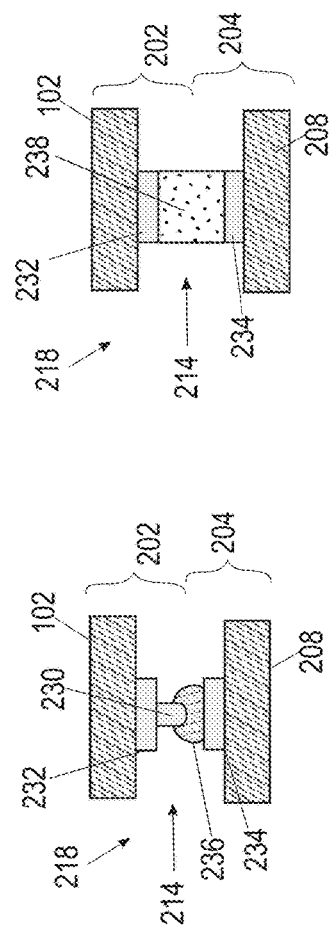
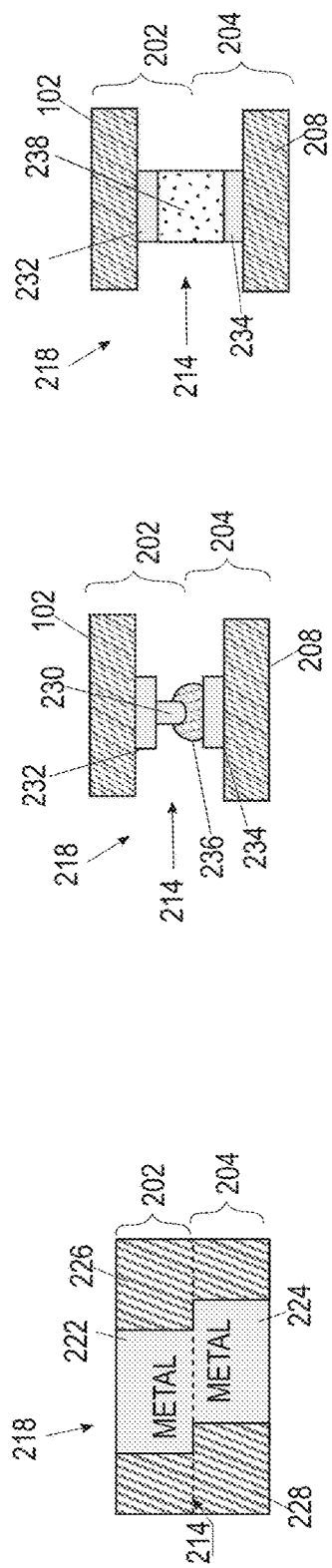

US 12,463,156 B2

PACKAGING ARCHITECTURES FOR SUB-TERAHERTZ RADIO FREQUENCY DEVICES

TECHNICAL FIELD

The present disclosure relates to techniques, methods, and apparatus directed to packaging architectures for sub-terahertz (sub-THz) radio frequency (RF) devices in semiconductor integrated circuit (IC) packaging technologies.

BACKGROUND

Electronic circuits when commonly fabricated on a wafer of semiconductor material, such as silicon, are called ICs. The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1A is a simplified top view of an example microelectronic assembly, according to some embodiments of the present disclosure.

FIG. 1B is a simplified perspective view of details of the example microelectronic assembly of FIG. 1A, according to some embodiments of the present disclosure.

FIG. 1C is a simplified perspective view of a stacked antenna element of the example microelectronic assembly of FIG. 1A, according to some embodiments of the present disclosure.

FIG. 2A is a simplified cross-sectional view of an example microelectronic assembly used in imaging and sensing systems according to various embodiments of the present disclosure.

FIG. 2B is a simplified cross-sectional view of details of hybrid interconnects used in various embodiments of the microelectronic assembly according to the present disclosure.

FIG. 2C is a simplified cross-sectional view of details of solder-based interconnects used in various embodiments of the microelectronic assembly according to the present disclosure.

FIG. 2D is a simplified cross-sectional view of details of conductive adhesive type interconnects used in various embodiments of the microelectronic assembly according to the present disclosure.

DETAILED DESCRIPTION

Overview

Figure 3:
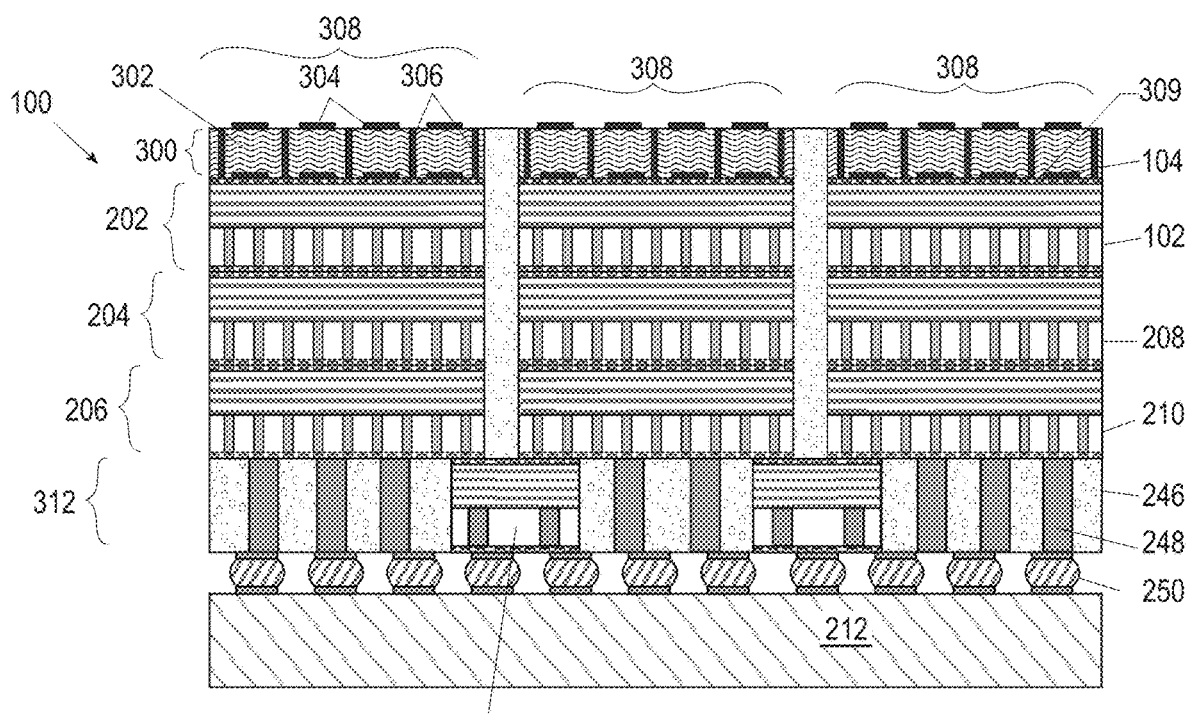
FIG. 3 is a simplified cross-sectional view of an example microelectronic assembly used in communication relays according to various embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Today's commercial communication (e.g., 5G) and automotive radar systems operate at relatively low RF or low-millimeter wave frequencies, for example, in the range of 2-77 gigahertz (GHz). Future communication and imaging or other sensing systems target frequencies of operation beyond 100 GHz reaching even into the sub-THz domain. Such communication and/or imaging systems typically employ an array (e.g., two dimensional (2D)) of antennas which are typically uniformly spaced at a pitch of half the operating wavelength ("half wavelength cell"). Such an array can be an actively driven array (e.g., phased array) or a passive array illuminated by an external millimeter wave/sub-THz transceiver (e.g., reflectarray or a communication relay device). Packaging of such 5G systems that employ antenna arrays needs integration of RF, analog, and digital functions along with passives and other system components in a single module.

In general, phrased array antennas, also termed "RF patch antennas," comprise a collection of antenna elements assembled together such that the radiation pattern of each individual element constructively combines with that of neighboring antennas to generate an effective radiation pattern (i.e., main lobe) for the energy radiated in a desired direction. The direction of radiation can be manipulated by changing a phase of the signal fed into each antenna element. A benefit of the phased array antenna over a mechanical antenna is the ability to radiate multiple beams simultaneously, which could track multiple targets or manage multiple data streams of user data. This is accomplished by digital signal processing of the multiple data streams at baseband frequencies. The typical implementation of this array uses patch antenna elements configured in equally spaced rows and columns. In ground-based radar system, such an antenna array can comprise over 100,000 antenna elements.

The many challenges of array design in such large systems include control line routing, power supply management, pulsed circuitry, thermal management, etc. in addition to a drive in the industry toward low profile arrays having less volume and weight. A traditional plank architecture for phased arrays uses small-sized printed circuit board (PCB) planks with electronics on them perpendicularly fed into the backside of an antenna PCB. However, this vertical stacking approach cannot be translated directly into IC dies because conventional packaging technologies, including materials and processes, do not support such vertically integrated IC dies.

In addition, for both types of arrays (i.e., active phased array and passive array) more electronics (i.e., circuitry) is needed to complete the functionality of the system including power amplifiers, low noise amplifiers, intermediate frequency (IF) filters, baseband circuitry (e.g., attenuators, phase shifters, filters, wideband amplifiers, analog-to-digital conversion circuitry (e.g., analog-to-digital converter (ADC) or digital-to-analog converter (DAC)), etc.), memory circuitry (e.g., static random-access memory (SRAM), registers, security fuses, etc.) and microprocessor circuitry (e.g., controllers, arithmetic logic units, processor cores, etc.). Such circuitry, e.g., for phased and reflectarrays, must be integrated within the footprint of each "half wavelength cell." As frequency increases, the wavelength decreases and the overall footprint area available, especially on IC dies, reduces quadratically with frequency of operation. This poses a challenge to fit all needed circuitry within the available area. Many traditional approaches used for RF packages with antennas on package substrates or PCBs are thus not applicable to sub-THz devices.

Embodiments of the present disclosure provide a microelectronic assembly comprising: a first IC die in a first layer comprising an array of RF patch antennas on a side opposite to a second layer; a second IC die in the second layer between the first layer and a third layer; and a third IC die in the third layer. The first IC die comprises RF and analog circuitry to support the RF patch antennas, the first IC die is part of an array of IC dies having similar size and functionalities as the first IC die, the second layer and the third layer comprise dielectric with through-dielectric vias (TDVs) surrounding the second IC die and the third IC die, respectively, and an interface between adjacent layers comprises die-to-die (DTD) interconnects. In some embodiments, the DTD interconnects have silicon-level interconnect density.

As used herein, the term "silicon-level" interconnect density comprises interconnect density greater than 10,000 connections per square millimeter. The term refers to trace pitch and/or via density that is generally found within an IC die (e.g., in metallization layers of the IC die above the active region) as opposed to interconnect density between IC dies of older packaging technologies (e.g., solder-based C4 or larger interconnects). Interconnects with silicon-level interconnect density may have pitch ranging between 0.5 micrometer and 10 micrometers (i.e., in one embodiment, the interconnects may have a pitch of 0.5 micrometer; in another embodiment, the interconnects may have a pitch of 2 micrometer; etc.).

Embodiments of the present disclosure also provide an IC package comprising: a first array of IC dies in a first layer comprising an array of RF patch antennas on a side of the IC dies opposite to a second layer; a second array of IC dies in the second layer between the first layer and a third layer; and a third array of IC dies in the third layer. The first array comprises RF and analog circuitry (e.g., to support the RF patch antennas), the IC dies in the first array, the second array and the third array comprise through-substrate vias (TSVs), and an interface between adjacent layers comprises DTD interconnects. As used herein, the term "RE circuitry" refers to electrical circuits for generating, transmitting, receiving, processing, etc. electrical and electromagnetic signals ranging in frequency from sub-THz to as low as 9 or 10 kilohertz (kHz).

Embodiments of the present disclosure further provide a method comprising: forming a first layer having a first plurality of IC dies surrounded by dielectric; forming a second layer over the first layer, the second layer comprising a second plurality of IC dies surrounded by dielectric; and forming a third layer over the second layer, comprising attaching a third plurality of IC dies having RF patch antennas on a side opposite to the second layer.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, silicon carbide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of input/output (I/O) functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., metal-oxide semiconductor field effect transistors (MOSFETs). In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides (e.g., structures that guide and confine light waves), including optical fiber, optical splitters, optical combiners, optical couplers, and optical vias.

The term "conductive trace" may be used to describe an electrically conductive element isolated by an insulating material. Within IC dies, such insulating material comprises interlayer low-k dielectric that is provided within the IC die. Within package substrates, and PCBs such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "metallization stack" may be used to refer to a stack of one or more interconnects for providing connectivity to different circuit components of an IC die/chip and/or a package substrate.

In context of a stack of dies coupled to one another or in context of a die coupled to a package substate, the term "interconnect" may also refer to, respectively, DTD interconnects and die-to-package substrate (DTPS) interconnects.

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some, or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, some of all of the DTD interconnects may include hybrid bonds (e.g., metal-to-metal and oxide-to-oxide bonds), also called hybrid direct bonds, or direct bond interconnects. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be unpackaged dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one or more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity, and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photo-imageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/ materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
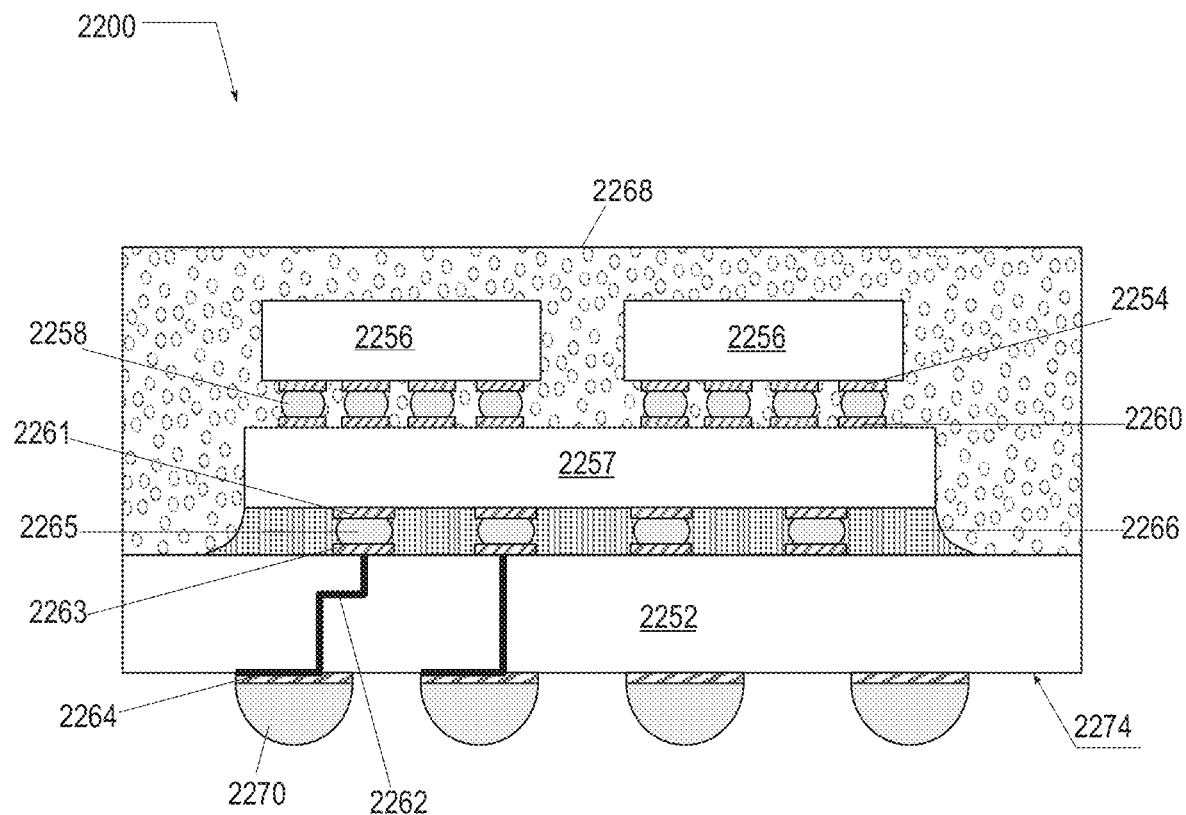
FIG. 10 is a cross-sectional view of a device package that includes one or more microelectronic assemblies in accordance with any of the embodiments disclosed herein.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 110a-110e), such a collection may be referred to herein without the letters (e.g., as "110").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

EXAMPLE EMBODIMENTS

FIG. 1A is a simplified top view of a microelectronic assembly 100 according to some embodiments of the present disclosure. Microelectronic assembly 100 comprises a plurality interconnected IC dies 102 having RF patch antennas 104. Individual ones of IC dies 102 (also referred herein as IC die 102 in the singular) comprise an array of RF patch antennas 104, that when combined with the plurality of IC dies 102 forms a larger array of RF patch antennas 104 spanning microelectronic assembly 100. IC dies 102 may be arranged in an array of rows and columns, so that the array of RF patch antennas 104 are arranged in a large uniform array across microelectronic assembly 100. IC dies 102 comprise RF and analog circuitry to support RF patch antennas 104 in some embodiments. In some embodiments, RF patch antennas 104 may be phased (e.g., adapted for electronic steering of radiated beams of electromagnetic energy in space without physical movement of the antennas); in other embodiments, RF patch antennas 104 may not be phased (e.g., static, and adapted to reflect and/or receive electromagnetic radiation); in some embodiments, a portion of RF patch antennas 104 may be phased, and another portion of RF patch antennas 104 may not be phased.

FIG. 1B shows a perspective view of a portion of the array comprising RF patch antennas 104 on IC die 102. A single element of RF patch antennas 104, made of a conductive material such as copper, is a half wavelength square, i.e., each length (and/or width) 106 measures half the wavelength of the electromagnetic radiation being transmitted (or received). A pitch 108 (i.e., center-to-center distance) between two adjacent elements of RF patch antennas 104 is also a half wavelength. For frequencies from 100 GHz to 1000 GHz, the wavelength ranges from approximately 3 millimeters to 0.3 millimeter. Thus, a half wavelength varies between approximately 1.5 millimeter and 0.15 millimeter. In other words, in some embodiments, length (and/or width) of a single element of RF patch antennas 104 is 1.5 millimeter and pitch is 1.5 millimeter; in other embodiments, length (and/or width) of a single element of RF patch antennas 104 is 0.15 millimeter and pitch is 0.15 millimeter; etc. Sizes of individual IC dies may vary from 100 millimeter by 100 millimeter in some embodiments to 5 millimeters by 5 millimeter in some other embodiments. Thickness of IC dies 102 may range between 10 micrometers in some embodiments to 400 micrometers in other embodiments.

RF patch antennas 104 may comprise a stacked array comprising N stacks 110(1)-110(N), N varying according to the performance desired in some embodiments, as shown by an individual RF patch antenna element in FIG. 1C. A bottom stack 110(1) may comprise a ground plane; an intermediate layer may comprise a feeding line and coupling slot; other layers may comprise dielectric material surrounding patch elements; yet other layers may comprise standoff/spacer elements comprised of relatively thick dielectric material (e.g., silicon oxide); the multi-layer structure may comprise an individual one of RF patch antennas 104, an array of which may be provisioned on a single IC die 102, and several such arrays in microelectronic assembly 100.

Turning back to FIG. 1A, the plurality of IC dies 102 may also comprise one or more IC dies 120 sparsely distributed in the array. IC dies 120 may comprise non-RF circuitry, such as extra memory, or configuration circuitry, security tile, etc. In such embodiments, IC dies 120 may have fewer RF patch antennas 104 than IC dies 102. In some embodiments (e.g., as shown), IC die 120 may comprise only a linear arrangement of RF patch antennas 104 along the periphery. In some other embodiments, IC die 120 may not have any RF patch antennas 104. IC die 120 may be used for customization in some embodiments. Because IC dies 120 contain fewer number of RF patch antennas 104, they may be located sparsely within the array of IC dies 102 (and not as densely as IC dies 102) so as not to degrade performance of the RF transmission (or reception) of the array of RF patch antennas 104. Thus, the sparse number and dispersed locations of IC dies 120 in microelectronic assembly 100 may not significantly affect the overall performance of the imaging and sensing system comprising, or comprised in, microelectronic assembly 100.

In some embodiments, IC dies 102 may be fabricated using a process that is suitable for RF circuitry and RF patch antennas 104, such as gallium nitride-based processes, for example, to generate power amplifiers on III/V gallium nitride substrates, or indium phosphide substrates, or silicon carbide substrates etc. On the other hand, IC die 120 may be made using other processes more suited for the circuitry comprised therein, such as standard complementary metal-oxide semiconductor process (CMOS) processes, or beyond CMOS processes for digital circuits with very low power consumption.

FIG. 2A is a simplified cross-sectional view of microelectronic assembly 100 according to various embodiments of the present disclosure. In the embodiment shown, microelectronic assembly 100 comprises quasi-monolithic packaging architecture having three layers 202, 204 and 206. In many embodiments, a thickness of the layers (e.g., 202, 204, 206) may be less than 40 micrometers. IC dies 102 with RF patch antennas 104 and IC dies 120 may be in layer 202. IC dies 208 may be in layer 204. IC dies 210 may be in layer 206. A package substrate 212 may be coupled to layer 206 in many embodiments. As shown in the figure, layers 202, 204 and 206 are not coplanar. Interfaces between any two adjacent layers, for example, interface 214 between layers 202 and 204, interface 216 between layers 204 and 206, may comprise DTD interconnects, for example, DTD interconnects 218 and 220, respectively. As used herein, the term "interface" when used in reference to a structural connection between two components refers to a boundary, a joint, or attached surfaces of dissimilar materials of those components.

Examples of three different embodiments of DTD interconnects 218 are shown in FIGS. 2B-2D. These examples apply to any DTD interconnects in the various embodiments disclosed herein, including DTD interconnects 220. FIG. 2B shows an example of DTD interconnects 218 comprising hybrid bonds. At interface 214 between layer 202 and layer 204, conductive contact 222 of layer 202 (e.g., belonging to IC die 102 or 120) may bond with conductive contact 224 of layer 204 (e.g., belonging to IC die 208); likewise, dielectric 226 (e.g., silicon oxide, silicon nitride, silicon oxynitride, etc.) in layer 202 (e.g., belonging to IC die 102 or 120) may bond with dielectric 228 (e.g., silicon oxide, silicon nitride, silicon oxynitride, etc.) in layer 204 (e.g., belonging to IC die 208). The bonded interconnects form DTD interconnects 218, comprising hybrid bonds, providing electrical and mechanical coupling between layer 202 and layer 204.

FIG. 2C shows an example of DTD interconnects 218 comprising solder-based bonds. Copper pillar 230 on bond pad 232 of IC die 102 is attached to mating pad 234 on IC die 208 with solder 236. Although copper pillar 230 is shown only on bond pad 232, in some embodiments, similar copper pillars may also be formed on mating pad 234 and the two copper pillars may be coupled by solder. Further, although only copper is mentioned, other alloys may be formed at the interfaces of the attachments based upon the metal of the underlying bond pads 232 and 234 and material composition of solder 236.

FIG. 2D shows an example of DTD interconnects 218 comprising anisotropic conductive adhesive 238. Bond pad 232 of IC die 102 is conductively coupled to mating pad 234 on IC die 208 with anisotropic conductive adhesive 238. In some embodiments, a thermosetting resin containing conductive particles is deposited on one side, for example, over layer 204 of interface 214, for example, using a lamination process. The mating layer, for example, layer 202 (and/or IC die 102 or 120 as appropriate) may be placed thereover and the two sides are pressed together to create a tacky but removable bond. Thereafter, the assembly is heated either locally or in an oven, for example, to 100° C. for a short amount of time (e.g., 1 second or less) to cure the anisotropic conductive adhesive and create DTD interconnects 218.

Turning back to FIG. 2A, any IC die in microelectronic assembly 100 (e.g., IC dies 102, 120, 208, 210) may comprise several layers: a semiconductor substrate 240 having active devices (e.g., transistors, diodes, etc.) and a metallization layer 242 comprising layers of dielectric (e.g., interlayer dielectric (ILD)) and metallization routing (e.g., metal layers between ILD layers and vias through the ILD). Some of the IC dies may also include TSVs 244 through semiconductor substrate 240. Semiconductor substrate 240, metallization layer 242 and TSVs 244 are shown in reference to IC die 210 merely for ease of illustration; any IC die in microelectronic assembly may comprise layers similar to semiconductor substrate 240 and metallization layer 242 and TSVs 244. In many embodiments, the ILD layers of IC dies 102 in layer 202 may include thicker oxide and thicker metals than ILD layers of other IC dies in other layers, for example, to achieve high efficiency antennas, low loss RF interconnects etc.

In the example embodiment shown, the IC dies (e.g., IC die 102) in one layer (e.g., 202) are coupled to the IC dies (e.g., 208) in another layer (e.g., 208) in a face-to-back (FTB) configuration; various other configuration, for example, face-to-face (FTF) or back-to-back (BTB) configurations may also be used within the broad scope of the embodiments depending on particular needs, with TSVs that provide electrical coupling to the active devices. In many embodiments where RF patch antennas 104 are provisioned on the faces of IC dies 102, only a FTB or BTB configuration may be possible for such IC dies.

In some embodiments, IC dies in any layer (e.g., 202, 204, 206) may be embedded in, or surrounded by, a dielectric 246 (e.g., silicon oxide, silicon nitride, mold compound). TDVs 248, also referred to as through-mold vias (TMVs) where the dielectric is a mold compound, may facilitate electrical coupling between two opposing sides of the respective layer, for example, for power delivery and high-speed signaling. Although dielectric 246 and TDVs 248 are shown in reference to layer 204, any other such layer in microelectronic assembly 100, for example, layer 206, may also comprise similar dielectric 246 and TDVs 248.

In various embodiments, selection of the material for dielectric 246 may be appropriately based on recursive re-implementation and hierarchical coupling of microelectronic assembly 100. In some embodiments, dielectric 246 may comprise silicon oxide, silicon nitride or other inorganic dielectric materials compatible with semiconductor manufacturing process. In some other embodiments, dielectric 246 may alternatively comprise organic dielectric materials, such as polyimide materials, glass reinforced epoxy matrix materials, organic materials such as silica-filled epoxy, or a low-k or ultra-low-k dielectric (e.g., carbon-doped dielectrics, fluorine-doped dielectrics, porous dielectrics, organic polymeric dielectrics, photoimageable dielectrics, and/or benzocyclobutene-based polymers).

In many embodiments where microelectronic assembly 100 is comprised in an imaging and sensing system, IC die 208 may comprise a relatively small piece of IC die (e.g., smaller than IC die 102) located under edges of two adjacent IC dies in layer 202 (e.g., IC dies 102 and/or IC dies 120) and providing electrical coupling (e.g., pass-through) between the interconnected IC dies. In such embodiments, IC die 208 may function as bridge dies. In such embodiments, IC die 210 may comprise baseband circuitry for RF patch antennas 104. As used herein, the term "baseband circuitry" refers to any electronic circuit capable of generating communication signals at one or more baseband frequencies, including direct current (DC), for the purpose of modulating other communication signals carrying data streams at higher frequencies. Typical baseband circuitry comprises DAC, ADC, filters, operational amplifiers, oscillators, attenuators, phase shifters, wideband amplifiers, etc. In some embodiments, IC dies 208 may comprise circuitry to synchronize signals (e.g., clock signals, digital signals) communicated between IC dies 102 in layer 202. Although not shown, some embodiments of microelectronic assembly 100 used in imaging and sensing systems may comprise a superstrate layer (e.g., an adjacent and parallel overlaying dielectric layer, such as a dielectric layer transparent to electromagnetic radiation) over IC dies 102 as described in reference to other embodiments and figures below. Further, although not shown, some embodiments of multi-stacked dies in microelectronic assembly 100 may comprise thermal interface layers or vias, some of them particularly engineered to conduct and spread heat (e.g., microdiamond composite materials with organic or inorganic filler material such as silicon oxide, diamond-silver thermal vias, thermally infused aluminum nitride microparticles, and others).

Layer 206 may be coupled to package substrate 212 with DTPS interconnects 250. In the example embodiment shown, DTPS interconnects 250 comprise solder-based interconnections. Although not shown so as not to clutter the drawings, one or more of layers 202, 204 and 206 (and others where applicable) may comprise redistribution layers (RDL) comprising dielectric (e.g., polyimide, silicon oxide, silicon nitride) with electrical pathways therein to route or reroute between interconnects of a first pitch to interconnects of a different, second pitch. For example, such RDL may facilitate routing at an interface between layer 202 and layer 204 (e.g., to route between TDVs 248 in the respective layers.

In some embodiments, package substrate 212 may comprise an organic substrate; in other embodiments, package substrate 212 may comprise an inorganic interposer (e.g., made of glass, ceramic or semiconductor materials). In some embodiments, package substrate 212 may comprise multiple layers of conductive traces embedded in one or more layers of organic dielectric. For example, package substrate 212 may comprise a laminate substrate with several layers of metal planes or traces that are interconnected to each other by through-hole plated vias, with 10 routing planes on the top and bottom layers, while the inner layers are used as a ground and power plane. In yet other embodiments, package substrate 212 may comprise a composite of organic and inorganic materials, for example, with an embedded semiconductor die in an organic substrate. In some embodiments, package substrate 212 may comprise an inorganic interposer with active circuits therein; in other embodiments, package substrate 212 may comprise an inorganic interposer with no active circuits therein.

Such a quasi-monolithic hierarchical architecture as depicted in FIG. 2A allows dies of disparate manufacturing technologies (e.g., technology node, or process node, or simply node) to be coupled together seamlessly within microelectronic assembly 100. In other words, microelectronic assembly 100 may allow heterogeneous integration. In a general sense, different processes often imply different circuit generations and architectures. Smaller (or more recent) the processing technology, smaller are the feature sizes, and consequently, the resulting transistors are both faster and more power efficient. For example, microelectronic assembly 100 may include IC die 102 manufactured using gallium nitride process, IC die 210 manufactured using 22 nm process and IC die 208 manufactured using 45 nm process.

In some embodiments, one or more IC dies of microelectronic assembly 100 that are not constrained by any size limitations imposed by RF patch antennas 104 may comprise any size, including ultra-small footprint less than 10 mm$^2$. In yet other embodiments, one or more IC dies in any layer except layer 202 may comprise other microelectronic assemblies, such as microelectronic assembly 100, in a recursive (e.g., nested, hierarchical) arrangement. For example, IC die 210 may comprise structures and components substantially similar to microelectronic assembly 100. In yet other embodiments, one or more of the IC dies on any layer except layer 202 may comprise a plurality of semiconductor dies (e.g., IC dies) stacked one on top of another, electrically coupled with high-density DTD interconnects.

FIG. 3 is a simplified cross-sectional view of microelectronic assembly 100 according to various embodiments of the present disclosure. A top layer 300 comprising superstrate 302 may be provided over RF patch antennas 104 in some embodiments. As used herein, "superstrate" refers to any dielectric layer, overlaying, adjacent, and parallel to another layer and may also be called a substrate in a configuration in which it is sandwiched between two layers. Superstrate 302 may be fabricated of glass, alumina, silicon, high-resistivity silicon, or other such dielectric materials suitable for the desired performance of RF patch antennas 104. In various embodiments, superstrate 302 may be around 10-500 micrometer thick (i.e., in some embodiments, superstrate 302 may be 10 micrometers thick; in another embodiments, superstrate 302 may be 100 micrometers thick; and so on). Increased superstrate thickness may correspond to increased antenna performance in terms of radiation efficiency in some embodiments. In many embodiments, a bandwidth and gain of RF patch antennas 104 are determined by the thickness and dielectric constant of superstrate 302. For example, a thick superstrate 302 having a dielectric constant $D_k$ may result in a wider bandwidth than a thinner superstrate 302 with the same dielectric constant $D_k$. In many embodiments, the thickness of superstrate 302 may vary according to the wavelength of the electromagnetic radiation received or transmitted at RF patch antennas 104.

Superstrate 302 may comprise antenna elements 304 and shielding vias 306. In some embodiments, antenna elements 304 may comprise parasitic antenna elements adapted to shape a radiation beam of the array of RF patch antennas 104. Antenna elements 304 may have the same shape as the RF patch antennas 104 and may be arranged in the same pattern as RF patch antennas 104 in some embodiments. Each individual antenna element 304 is coupled to its corresponding driving RF patch antenna element through electromagnetic coupling, forming a broadband and high gain antenna element in combination.

Shielding vias 306 may comprise conductive material, providing electromagnetic shielding for energy radiated by individual ones of RF patch antennas 104. Shielding vias 306 may reduce coupling between adjacent elements of RF patch antennas 104, for example, by blocking waves from propagating from one antenna element to another such element. In addition, shielding vias 306 may reduce parasitic capacitive coupling between adjacent elements of RF patch antennas 104. In various embodiments, antenna elements 304 and shielding vias 306 may be formed of suitable conductive material, such as copper, gold plated copper and/or nickel.

In some embodiments, superstrate 302 with antenna elements 304 and shielding vias 306 may be created over IC dies 102, for example, in wafer or panel form, as an RDL. In such embodiments, the method of fabrication may comprise depositing the dielectric material of superstrate 302, etching it, then using lithography technique to form antenna elements 304 and shielding vias 306 suitably. In other embodiments, superstrate 302 with antenna elements 304 and shielding vias 306 may be manufactured separately, and then coupled to IC dies 102, for example, as individual microelectronic assemblies, or in wafer or panel form over multiple microelectronic assemblies. In such embodiments, superstrate 302 may be electrically coupled and/or attached using DTD interconnects 309. DTD interconnects 309 may comprise hybrid bonds (e.g., as in FIG. 2B), or solder-based interconnects (e.g., as in FIG. 2C) or anisotropic conductive adhesive (e.g., as in FIG. 2D). Any other form of DTD interconnects 309 suitable for the material and functionality of superstrate 302 may be used within the broad scope of the embodiments.

In some embodiments, microelectronic assembly 100 may be part of or comprise a communication array (e.g., communication relay device, phased array) that has different underlying circuitry than imaging and sensing systems. In such embodiments, baseband circuitry may be provisioned on a separate chip whereas memory circuitry and low-power microprocessor circuitry may be provisioned in another separate chip. In some such embodiments, IC die 208 may comprise baseband circuitry while IC dies 210 may comprise memory circuitry and/or low-power microprocessor circuitry. In other such embodiments, IC die 208 may comprise memory circuitry and/or low-power microprocessor circuitry and IC dies 210 may comprise baseband circuitry. In such embodiments, baseband circuitry may comprise DAC, ADC, and a local oscillator (LO). In some embodiments, the IC die (e.g., 208 or 100) comprising baseband circuitry may be fabricated using an analog-optimized process. The other IC die (e.g., 210 or 209) comprising memory circuitry (and/or low-power microcontroller circuitry) may be fabricated using a process optimized for low-power operation and high-area efficiency.

In some embodiments, superstrate 302 may be common to all underlying IC dies 102 in microelectronic assembly 100. In other embodiments (e.g., as shown), separate IC dies 102 may have separate superstrate 302 disposed thereon. A vertical stack comprising superstrate 302, IC die 102, IC die 208, and IC die 210 may together comprise a unit 308. Individual units 308 may be placed adjacent to each other and electrically coupled (e.g., pass-through) together along their edges with IC dies 310 in a layer 312. In some embodiments, IC dies 310 may comprise circuitry to synchronize digital signals communicated between IC dies 102 in separate units 308. Layer 312 may comprise dielectric 246 with TDVs 248 therein surrounding IC dies 310. Layer 312 may be coupled to package substrate 212 with DTPS interconnects 250 in such embodiments.

Figure 4:
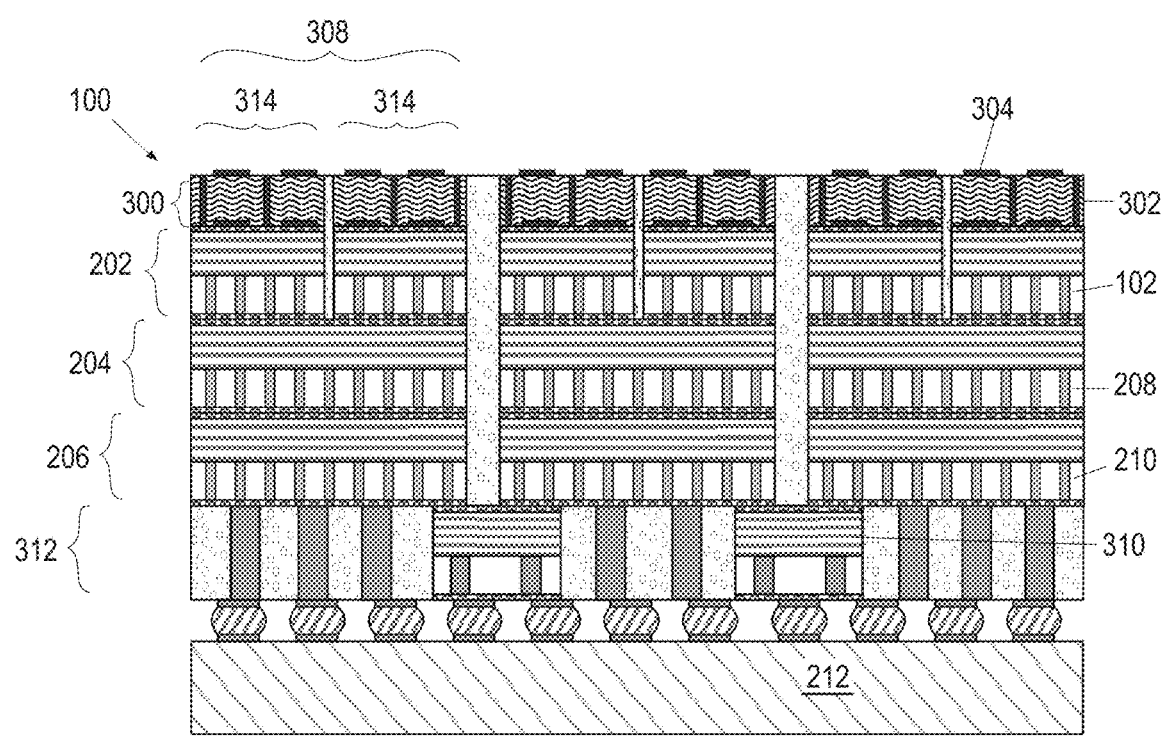
FIG. 4 is a simplified cross-sectional view of another example microelectronic assembly used in communication relays according to various embodiments of the present disclosure.

FIG. 4 is a simplified cross-sectional view of another embodiment of microelectronic assembly 100 of FIG. 3. Superstrate 302 may comprise antenna elements 304 and shielding vias 306 as discussed in relation to the preceding figure. In the example embodiment shown, superstrate 302 and its underlying IC die 102 may comprise a separate unit 314, several such units electrically coupled (e.g., pass-through) by IC die 208 in underlying layer 204. Units 314 may be encompassed in unit 308 as in the embodiment described in the preceding figure. In some embodiments (as shown), IC die 208 may be common to both units 314 such that no unit 314 shares more than one IC die 208. In some other embodiments, where unit 308 comprises more than one IC die 208, a single unit 314 may be coupled to more than one IC die 208 within unit 308. In yet other embodiments that do not have discretely identifiable units 308 or 314, IC dies in each layer may be coupled to IC dies in other layers in different configurations (e.g., sharing some IC dies, overlapping IC dies, etc.) based on particular needs. All such configurations and arrangements are encompassed within the broad scope of the embodiments.

Figure 5:
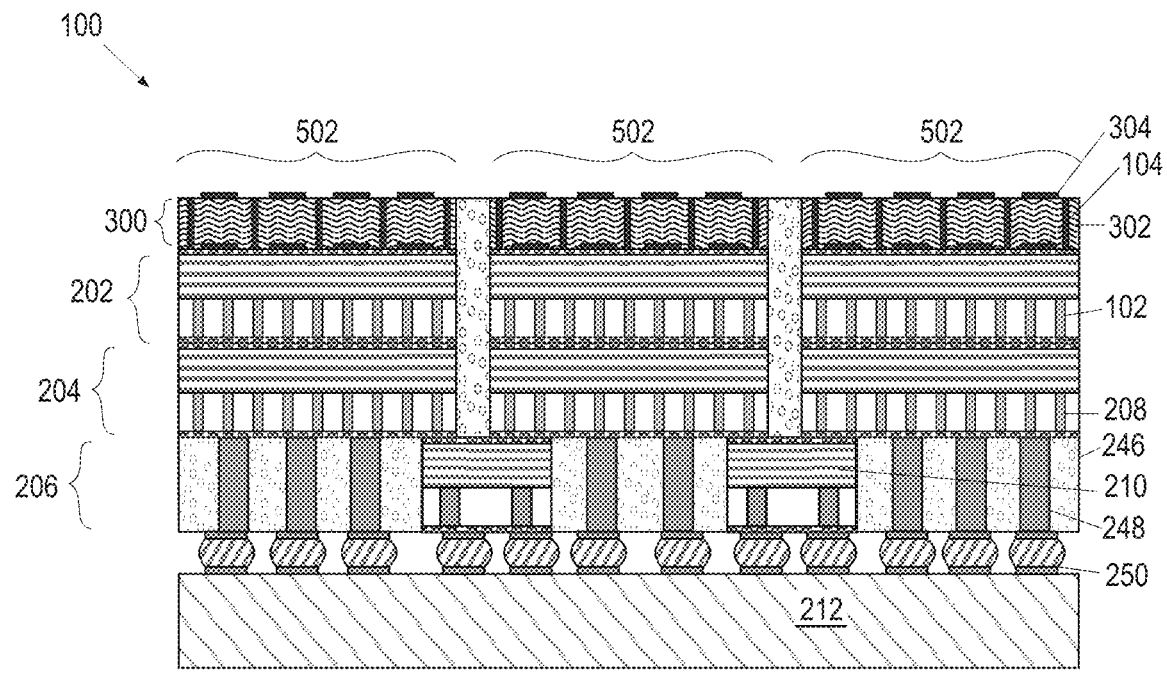
FIG. 5 is a simplified cross-sectional view of an example microelectronic assembly used in reflectarrays according to various embodiments of the present disclosure.

FIG. 5 is a simplified cross-sectional view of an example embodiment of microelectronic assembly 100 comprised in, or comprising, a reflectarray. In some embodiments the reflectarray comprises a planar surface of reflecting antennas, whose phase can be controlled and varied over the surface to obtain a focused reflected field of electromagnetic radiation from a separate feed source. For example, a phase distribution of concentric rings may be applied to focus the wavefronts from the feeding antenna into a plane wave; a progressive phase shift can be applied to the unit cells to steer the beam direction. The underlying circuitry of reflectarrays is different from imaging and sensing systems (e.g., FIG. 2A), or communication relay devices (e.g., FIGS. 3-4) discussed in reference to the preceding figures. As such, IC dies 208 in such embodiments may comprise memory circuitry and digital circuitry and other circuitry to support RF patch antennas 104. In some embodiments, the support circuitry may comprise phase shifting switches. IC dies 210 in layer 206 may comprise bridge dies, located underneath the edges of adjacent IC dies 208 in preceding layer 204 and electrically couples (e.g., pass-through connections) the adjacent IC dies 208. In some embodiments, IC dies 210 may comprise circuitry to synchronize digital signals communicated between IC dies 102 in layer 202.

In some embodiments, superstrate 302 may be common to all underlying IC dies 102 in microelectronic assembly 100. In other embodiments (e.g., as shown), separate IC dies 102 may have separate superstrate 302 disposed thereon. A vertical stack comprising superstrate 302, IC die 102, IC die 208 may comprise a unit 502. Individual units 502 may be placed adjacent to each other and electrically coupled (e.g., pass-through) together along their edges with IC dies 210 in a layer 204. In some embodiments, IC dies 210 may comprise circuitry to synchronize digital signals communicated between IC dies 102 in separate units 502. Layer 206 may comprise dielectric 246 with TDVs 248 therein surrounding IC dies 210. Layer 206 may be coupled to package substrate 212 with DTPS interconnects 250 in such embodiments.

Figure 6:
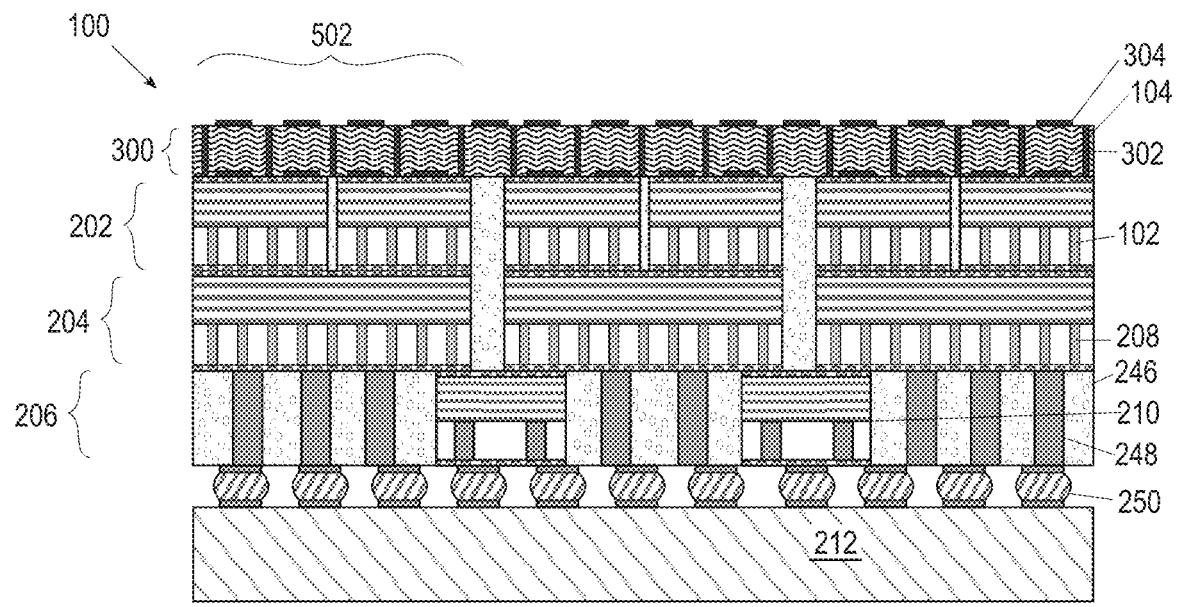
FIG. 6 is a simplified cross-sectional view of another example microelectronic assembly used in reflectarrays according to various embodiments of the present disclosure.

FIG. 6 is a simplified cross-sectional view of another example embodiment of microelectronic assembly 100 discussed in relation to FIG. 5. As shown in FIG. 6, in some embodiments, superstrate 302 may be common to all underlying IC dies 102 in microelectronic assembly 100. In some embodiments, several IC die 102 may be attached over a single IC die 208, which electrically couples them together. Such several IC die 102 may be encompassed in unit 502 as in the embodiment described in the preceding figure. In some embodiments (as shown), IC die 208 may be common to the several IC die 102 attached thereto such that no IC die 102 shares more than one IC die 208. In some other embodiments, where unit 502 comprises more than one IC die 208, a single IC die 102 may be coupled to more than one IC die 208 within unit 502. In yet other embodiments that do not have discretely identifiable units 502, IC dies in each layer may be coupled to IC dies in other layers in different configurations (e.g., sharing some IC dies, overlapping IC dies, etc.) based on particular needs. In some embodiments where a separate superstrate 302 is disposed over each individual IC die 102, such superstrate 302 and its underlying IC die 102 may comprise a separate unit, several such units being electrically coupled by IC die 208 in underlying layer 204. All such configurations and arrangements are encompassed within the broad scope of the embodiments.

Although not shown so as not to clutter the drawings, one or more of layers 300, 202, 204 and 206 (and others where applicable) may comprise RDL comprising dielectric (e.g., polyimide, silicon oxide, silicon nitride) with electrical pathways therein to route or reroute between interconnects of a first pitch to interconnects of a different, second pitch.

Figure 7:
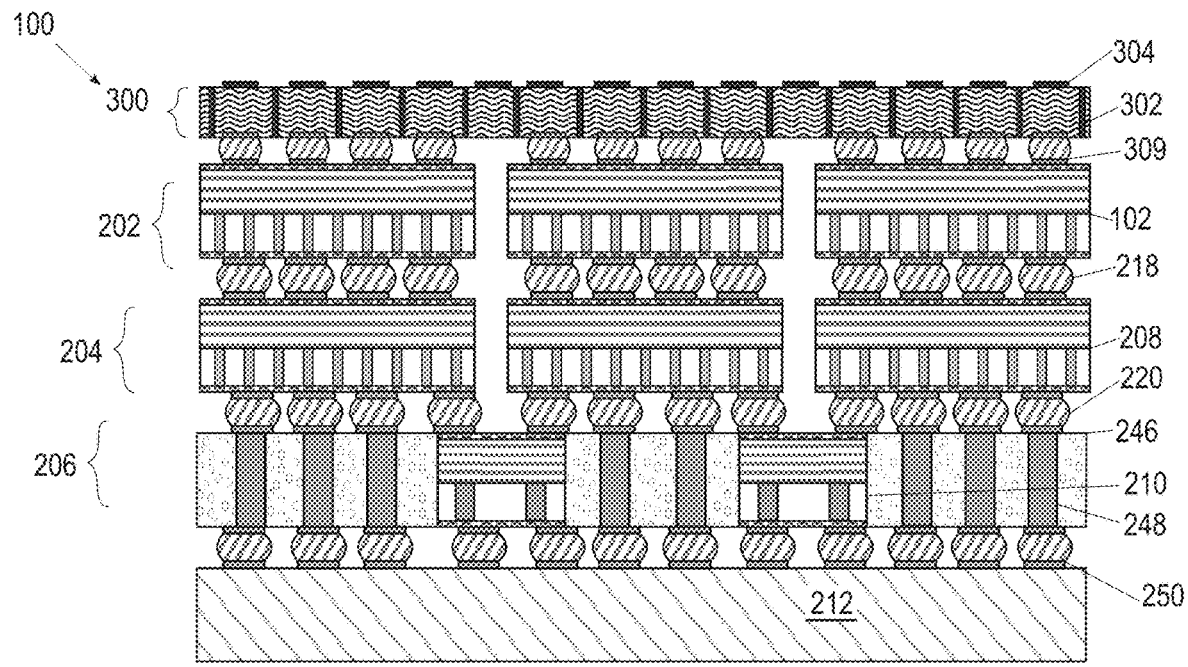
FIG. 7 is a simplified cross-sectional view of an example microelectronic assembly having solder-based interconnects according to various embodiments of the present disclosure.

FIG. 7 is a simplified cross-sectional view of an embodiment of microelectronic assembly 100 comprising solder-based interconnects between adjacent layers. In some embodiments, one or more IC dies used in microelectronic assembly 100 may be made using older semiconductor processing technologies, and consequently, may not have as fine a pitch compatible with certain types of DTD interconnects, such as hybrid bonds. In such embodiments, the layer comprising such IC dies may be bonded to adjacent layers using solder-based interconnects, which have coarser pitch than the silicon-level interconnect density of hybrid bonds. In some embodiments, solder-based interconnects may provide greater stand-off (e.g., distance) between adjacent layers, which may be desirable for performance (e.g., better RF antenna functionalities in terms of efficiency and/or gain), and/or reliability considerations. In some embodiments, the solder-based interconnects may be as shown in FIG. 2C with copper pillars and solder caps; in other embodiments, the solder-based interconnects may comprise flip-chip (e.g., C4) balls.

In some embodiments, DTD interconnects 218, 220 and 309 (and others) may comprise solder-based interconnects. Note that the interconnects shown in the figure are merely for illustrative purposes and are not drawn to scale. In some embodiments, DTD interconnects 218, 220 and 309 may comprise solder-based interconnects. In other embodiments, only some of DTD interconnects, for example, 309 and 218 may comprise solder-based interconnects, whereas other DTD interconnects, for example, 220, may comprise hybrid bonds. In such embodiments having more than one type of DTD interconnects, the solder-based interconnects may be coupled last among all other interconnects. For example, hybrid bonds may be formed before solder-based interconnects are used, because of the higher-temperature processing needed for hybrid bonds. In an example embodiment, where DTD interconnects 220 comprise hybrid bonds, and DTD interconnects 218 and 309 comprise solder-based interconnects, the bottom layers may be bonded before IC dies 102 and superstrate 302 are attached with solder-based interconnects.

Figure 8:
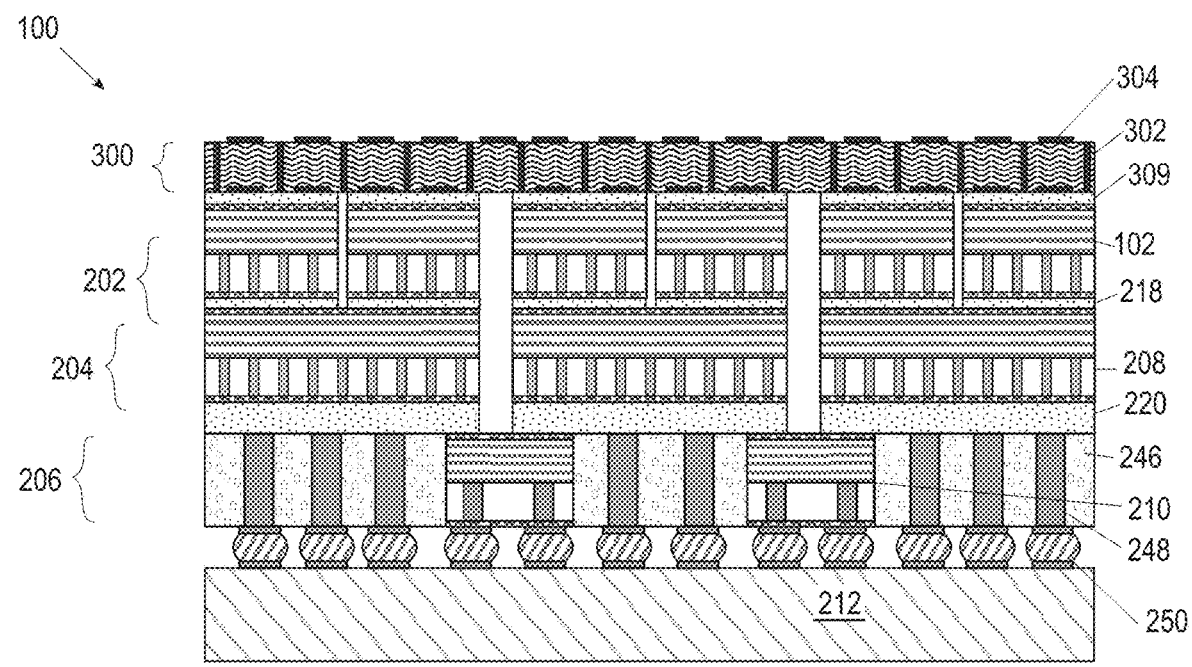
FIG. 8 is a simplified cross-sectional view of an example microelectronic assembly having conductive adhesive type interconnects according to various embodiments of the present disclosure.

FIG. 8 is a simplified cross-sectional view of an embodiment of microelectronic assembly 100 comprising conductive type of interconnects between adjacent layers. In some embodiments, one or more IC dies used in microelectronic assembly 100 may be made using older semiconductor processing technologies, and consequently, may not have as fine a pitch compatible with certain types of DTD interconnects, such as hybrid bonds. In such embodiments, the layer comprising such IC dies may be bonded to adjacent layers using anisotropic conductive type interconnects, which have coarser pitch than the silicon-level interconnect density of hybrid bonds. The anisotropic conductive interconnects may be formed by attaching anisotropic conductive film to the interface being coupled and then curing appropriately, for example, using heat. In some embodiments, the anisotropic conductive type interconnects may be as shown in FIG. 2D, between individual bond pads; in other embodiments, a film of anisotropic conductive film may be applied across the interface or in particular areas of the interface, for example, with a suitable mask.

In some embodiments, DTD interconnects 218, 220 and 309 may comprise anisotropic conductive type interconnects. In other embodiments, only some of DTD interconnects, for example, 309 and 218 may comprise anisotropic conductive type interconnects, whereas other DTD interconnects, for example, 220, may comprise hybrid bonds. In such embodiments having more than one type of DTD interconnects, the anisotropic conductive type interconnects may be coupled last among all other interconnects. For example, hybrid bonds may be formed before anisotropic conductive type interconnects are used, because of the higher-temperature processing needed for hybrid bonds. In an example embodiment, where DTD interconnects 220 comprise hybrid bonds, and DTD interconnects 218 and 309 comprise anisotropic conductive type interconnects, layers 206 and 204 may be bonded before IC dies 102 and superstrate 302 are attached with anisotropic conductive type interconnects.

In various embodiments, any of the features discussed with reference to any of FIGS. 1-8 herein may be combined with any other features to form a package with one or more ICs as described herein, for example, to form a modified microelectronic assembly 100. Some such combinations are described above, but, in various embodiments, further combinations and modifications are possible.

Example Methods

Figure 9:
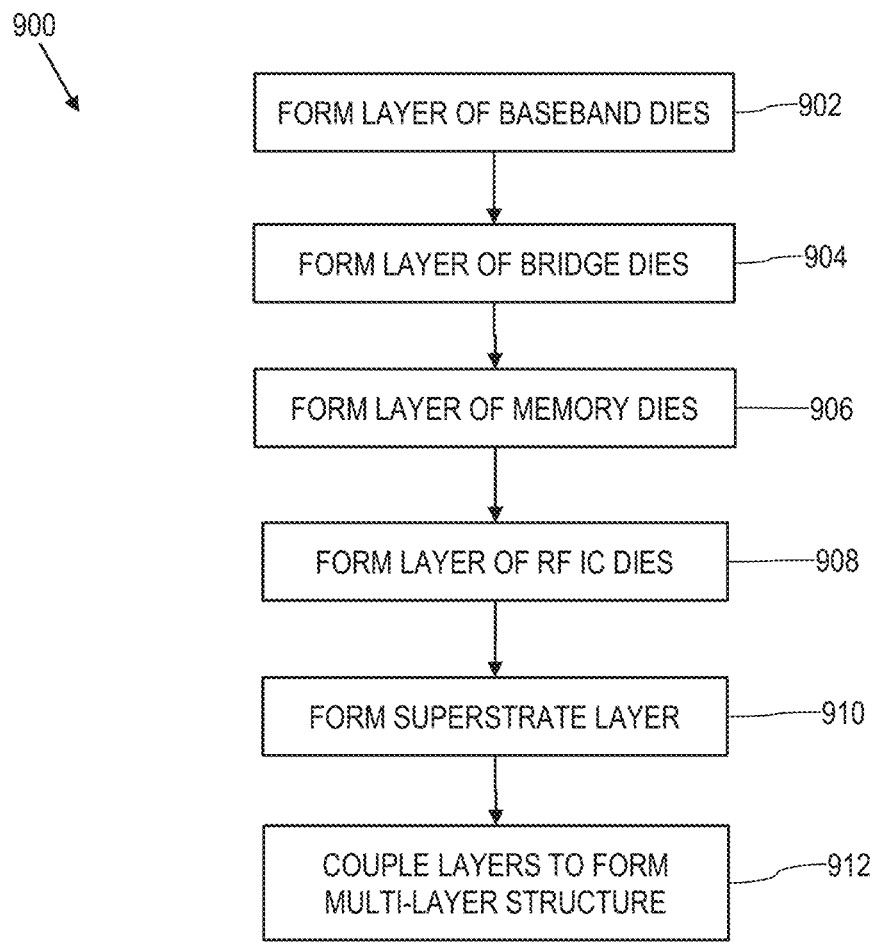
FIG. 9 is a flow diagram illustrating an example method associated with forming a microelectronic assembly according to various embodiments of the present disclosure.

FIG. 9 is a flow diagram of an example method 900 of fabricating microelectronic assembly 100, according to various embodiments of the present disclosure. Although FIG. 9 illustrates various operations performed in a particular order, this is simply illustrative, and the operations discussed herein may be reordered and/or repeated as suitable. Further, additional processes which are not illustrated may also be performed without departing from the scope of the present disclosure. Also, various ones of the operations discussed herein with respect to FIG. 9 may be modified in accordance with the present disclosure to fabricate others of microelectronic assembly 100 disclosed herein.

At 902, a layer of baseband dies may be formed. Baseband dies comprise IC dies (e.g., 208 or 210 depending on the particular embodiment of microelectronic assembly 100) having baseband circuitry therein. In some embodiments, the layer of baseband dies may comprise layer 204 and in other embodiments, the layer of baseband dies may comprise layer 206 according to the particular embodiment and functionality of microelectronic assembly 100 (e.g., as shown in the various preceding figures for imaging and sensing systems, communication relays, reflectarrays, etc.). In some embodiments, the operation comprises forming the baseband dies on monolithic silicon wafers, dicing them into individual IC dies, attaching the diced IC dies to a carrier substrate at predetermined locations, and forming a reconstituted wafer therefrom, for example, by forming TDVs 248 (e.g., copper pillars) around the baseband dies, and depositing dielectric (e.g., 246) around the baseband dies and TDVs 248. In other embodiments, operation 902 comprises forming the baseband dies at predetermined locations on a reconstituted wafer comprising other IC dies of microelectronic assembly 100 according to the particular embodiment (e.g., as shown in the various preceding figures for imaging and sensing systems, communication relays, reflectarrays, phased arrays etc.) and further building up the layer by forming TDVs 248 (e.g., copper pillars) around the baseband dies, and depositing dielectric (e.g., 246) around the baseband dies and TDVs 248.

At 904, a layer of bridge dies may be formed. Bridge dies comprise IC dies (e.g., 208, 210, or 310 depending on the particular embodiment of microelectronic assembly 100) having bridge circuitry therein. Bridge circuitry may comprise electrical pathways in a metallization stack of a semiconductor die without any active devices in some embodiments. In other embodiments, bridge circuitry may comprise electrical pathways in a metallization stack of a semiconductor die and active devices for certain limited functionalities, such as circuits to synchronize clocks, digital control signals etc. In various embodiments, the layer of bridge dies may comprise layers 204, 206, or 312 according to the particular embodiment and functionality of microelectronic assembly 100 (e.g., as shown in the various preceding figures for imaging and sensing systems, communication relays, reflectarrays, etc.). In some embodiments, operation 904 comprises forming the bridge dies on monolithic silicon wafers, dicing them into individual IC dies, attaching the diced IC dies to a carrier substrate at predetermined locations, and forming a reconstituted wafer therefrom, for example, by forming TDVs 248 (e.g., copper pillars) around the bridge dies, and depositing dielectric (e.g., 246) around the bridge dies and TDVs 248. In other embodiments, operation 904 comprises forming the bridge dies on the reconstituted wafer comprising other IC dies of microelectronic assembly 100, according to the particular embodiment (e.g., as shown in the various preceding figures, for imaging and sensing system, communication relays, reflectarrays, etc.) and further building up the layer by forming TDVs 248 (e.g., copper pillars) around the bridge dies, and depositing dielectric (e.g., 246) around the bridge dies and TDVs 248.

At 906, a layer of memory dies (e.g., 120, 208, 210) having memory circuitry may be formed. Memory dies comprise IC dies (e.g., 208 or 210 depending on the particular embodiment of microelectronic assembly 100) having memory circuitry or low-power microprocessor circuitry therein. In some embodiments, the layer of memory dies may comprise layer 204 and in other embodiments, the layer of memory dies may comprise layer 206 according to the particular embodiment and functionality of microelectronic assembly 100 (e.g., as shown in the various preceding figures for imaging and sensing systems, communication relays, reflectarrays, phased arrays, etc.). In some embodiments, operation 906 comprises forming the memory dies on monolithic silicon wafers, dicing them into individual IC dies, attaching the diced IC dies to a carrier substrate at predetermined locations, and forming a reconstituted wafer therefrom, for example, by forming TDVs 248 (e.g., copper pillars) around the memory dies, and depositing dielectric (e.g., 246) around the memory dies and TDVs 248. In other embodiments, operation 906 comprises forming the memory dies on the reconstituted wafer comprising other IC dies of microelectronic assembly 100, according to the particular embodiment (e.g., as shown in the various preceding figures, for imaging and sensing system, communication relays, reflectarrays, etc.) and further building up the layer by forming TDVs 248 (e.g., copper pillars) around the memory dies, and depositing dielectric (e.g., 246) around the bridge dies and TDVs 248.

At 908, a layer of RF IC dies (e.g., 102) having RF circuitry may be formed. RF IC dies comprise IC dies 102 having RF circuitry therein. In various embodiments, the layer of RF IC dies may comprise layer 202. In some embodiments, operation 908 comprises forming the RF IC dies on monolithic silicon wafers, dicing them into individual IC dies, attaching the diced IC dies to a carrier substrate at predetermined locations, and forming a reconstituted wafer therefrom, for example, by forming TDVs 248 (e.g., copper pillars) around the memory dies, and depositing dielectric (e.g., 246) around the memory dies and TDVs 248. In other embodiments, operation 908 comprises forming the RF IC dies on the reconstituted wafer comprising other IC dies of microelectronic assembly 100, according to the particular embodiment (e.g., as shown in the various preceding figures, for imaging and sensing system, communication relays, reflectarrays, phased arrays etc.) and further building up the layer by forming TDVs 248 (e.g., copper pillars) around the memory dies, and depositing dielectric (e.g., 246) around the bridge dies and TDVs 248. In some embodiments, operation 908 further comprises attaching IC dies 120 comprising non-RF circuitry in layer 202 at predetermined locations.

At 910, a superstrate layer may be formed. The superstrate layer comprises layer 300 having superstrate 302. In some embodiments, operation 910 comprises building up superstrate 302 with antenna elements 304 and shielding vias 306 as a RDL over IC dies 102 in wafer or panel form. In such embodiments, the method of fabrication may comprise depositing the dielectric material of superstrate 302, etching it, then using lithography technique to form antenna elements 304 and shielding vias 306 suitably. In other embodiments, operation 910 may comprise forming superstrate 302 with antenna elements 304 and shielding vias 306 separately from other IC dies and then coupling layer 300 to layer 202 at a later manufacturing step.

At 912, the individual layers formed in the preceding operations 902-910 may be coupled to form the multi-layer structure of microelectronic assembly 100. In some embodiments, operation 912 may comprise a series of steps after forming individual layers (e.g., 202, 204, 206, 312) separately. In such embodiments, one layer may be coupled to another layer according to the particular embodiment of microelectronic assembly 100 (e.g., as shown in the various preceding figures, for imaging and sensing system, communication relays, reflectarrays, etc.) using appropriate DTD interconnects, for example, hybrid bonds, solder-based interconnects, or anisotropic conductive adhesive. In some such embodiments, sub-structures of microelectronic assembly may be made as units (e.g., 308, 314, 502) and coupled to other structures of microelectronic assembly as appropriate. In other embodiments, operation 912 may be performed between each separate layer forming step, for example, as layers 202, 204, 206 and 312 as appropriate are built up sequentially one after another, with the DTD interconnects between adjacent layers as appropriate. In yet other embodiments, some layers may be made separately whereas other layers may be built up from underlying layers. Further, in some embodiments, more than one multi-layer structure of microelectronic assembly 100 may be manufactured on a single wafer or panel and then diced appropriately before attaching to package substrate 212. In other embodiments, individual ones of the multi-layer structure microelectronic assembly 100 including package substrate 212 may be made separately and assembled individually.

Furthermore, the operations illustrated in FIG. 9 may be combined or may include more details than described. Still further, method 900 shown in FIG. 9 may further include other manufacturing operations related to fabrication of other components of the semiconductor assemblies described herein, or any devices that may include semiconductor assemblies as described herein. For example, method 900 may include various cleaning operations, surface planarization operations (e.g., using chemical mechanical polishing (CMP)), operations for surface roughening, operations for depositing thermal interface materials, operations to deposit redistribution layers, operations to include barrier and/or adhesion layers as desired, and/or operations for incorporating packages as described herein in, or with, an IC die, a computing device, or any desired structure or device.

Example Devices and Components

Figure 11:
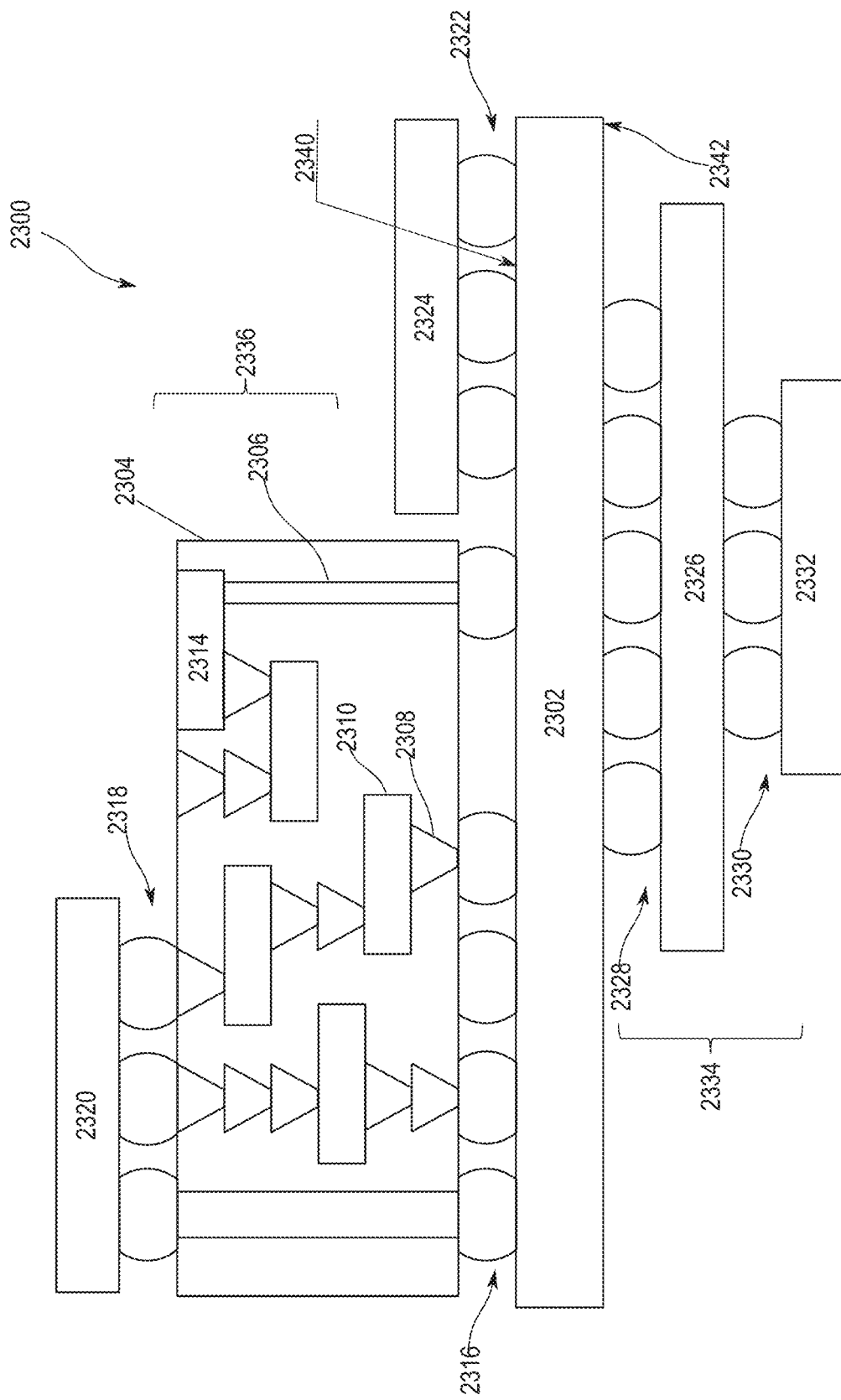
FIG. 11 is a cross-sectional side view of a device assembly that includes one or more microelectronic assemblies in accordance with any of the embodiments disclosed herein.
Figure 12:
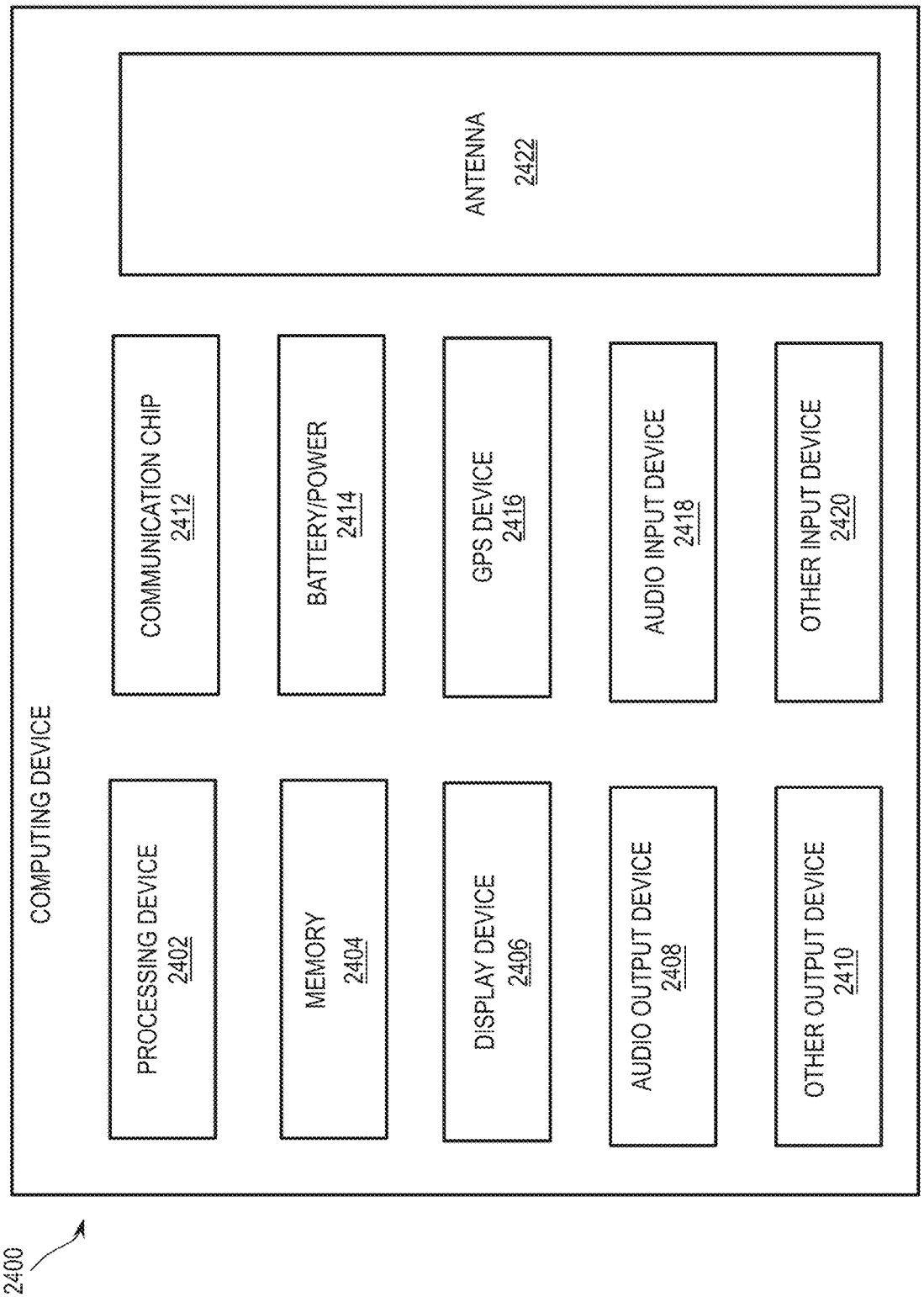
FIG. 12 is a block diagram of an example computing device that includes one or more microelectronic assemblies in accordance with any of the embodiments disclosed herein.

The packages disclosed herein, e.g., any of the embodiments shown in FIGS. 1-8 or any further embodiments described herein, may be included in any suitable electronic component. FIGS. 10-12 illustrate various examples of packages, assemblies, and devices that may be used with or include any of the IC packages as disclosed herein.

FIG. 10 is a side, cross-sectional view of an example IC package 2200 that may include IC packages in accordance with any of the embodiments disclosed herein. In some embodiments, the IC package 2200 may be a system-in-package (SiP).

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 11.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., high-bandwidth memory), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fanout (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 11 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 10.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 10. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 12 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 10). In yet another example, any one or more of the components of computing device 2400 may include an IC device assembly 2300 (e.g., as shown in FIG. 11).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-chip (SOC) die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more digital signal processors (DSPs), ASICs, CPUs, GPUs, crypto-processors (specialized processors that execute cryptographic algorithms within hardware), server processors, or any other suitable processing devices. Computing device 2400 may include a memory 2404, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random-access memory (eDRAM) or spin transfer torque magnetic random-access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

SELECT EXAMPLES

The following paragraphs provide various examples of the embodiments disclosed herein.

Example 1 provides a microelectronic assembly comprising: a first IC die in a first layer, the first layer comprising an array of RF patch antennas on a side of the IC dies opposite to a second layer; a second IC die in the second layer between the first layer and a third layer; and a third IC die in the third layer. The first IC die comprises RF and analog circuitry (e.g., to support the RF patch antennas), the first IC die is part of an array of IC dies having similar size and functionalities as the first IC die, the second layer and the third layer comprise a dielectric with TDVs therein surrounding the second IC die and the third IC die, respectively, and an interface between adjacent layers comprises DTD interconnects.

Example 2 provides the microelectronic assembly of example 1, in which the second IC die comprises a bridge die to electrically couple the first IC die to an adjacent IC die in the array, and the third IC die comprises baseband circuitry for the RF patch antennas.

Example 3 provides the microelectronic assembly of example 1, in which the dielectric is a first dielectric, and the microelectronic assembly further comprises: a dielectric layer (e.g., superstrate 302) comprising a second dielectric over the RF patch antennas; and a fourth IC die in a fourth layer, in which the dielectric layer is adjacent and parallel to the first layer, one of the second IC die and the third IC die comprises baseband circuitry for the RF patch antennas, the other of the second IC die and the third IC die comprises at least one of memory circuitry and microcontroller circuitry, and the fourth IC die comprises a bridge die to electrically couple adjacent IC dies in the third layer.

Example 4 provides the microelectronic assembly of example 1, further comprising: a dielectric layer (e.g., superstrate 302) over the RF patch antennas, adjacent and parallel to the first layer, in which: the second IC die comprises memory and digital circuits (e.g., to support the RF and analog circuitry of first IC die), and the third IC die comprises a bridge die to electrically couple adjacent IC dies in the second layer.

Example 5 provides the microelectronic assembly of any of examples 1-4, in which the interconnects comprise at least one of: hybrid bonds (e.g., distributed with silicon-level interconnect density), solder-based bonds, and anisotropic conductive adhesive.

Example 6 provides an IC package comprising: a first array of IC dies in a first layer comprising an array of RF patch antennas on a side opposite to a second layer; a second array of IC dies in the second layer between the first layer and a third layer; and a third array of IC dies in the third layer, in which: the first array comprises RF and analog circuitry (e.g., to support the RF patch antennas), the IC dies in the first array, the second array and the third array comprise through-substrate vias (TSVs), and an interface between adjacent layers comprises DTD interconnects.

Example 7 provides the IC package of example 6, in which a pitch of the array of RF patch antennas comprises half a wavelength of the RF waves operated on by the RF patch antennas.

Example 8 provides the IC package of any of examples 6-7, in which the second layer and the third layer comprise dielectric with TDVs dispersed therein.

Example 9 provides the IC package of any of examples 6-8, in which: the IC package is comprised in an imaging and sensing system, the second array of IC dies comprises circuitry to synchronize digital signals communicated between IC dies in the first array, and the third array of IC dies comprises baseband circuitry for the RF patch antennas.

Example 10 provides the IC package of any of examples 6-9, further comprising a superstrate over the RF patch antennas.

Example 11 provides the IC package of any of examples 10-11, in which the superstrate comprises separate superstrate units spanning individual IC dies in the first array.

Example 12 provides the IC package of any of examples 10-11, in which the superstrate comprises a single superstrate unit spanning the first array of IC dies.

Example 13 provides the IC package of any of examples 6-12, in which the RF patch antennas comprise multi-layer stacked antennas.

Example 14 provides the IC package of example 6, in which: the IC package is part of a communication relay device, one of the second IC die and the third IC die comprises baseband circuitry for the RF patch antennas, and the other of the second IC die and the third IC die comprises at least one of memory circuitry and microcontroller circuitry.

Example 15 provides the IC package of example 14, further comprising a fourth array of IC dies in a fourth layer, in which the fourth array of IC dies comprises circuitry to synchronize digital signals communicated between IC dies in the first array.

Example 16 provides the IC package of example 6, in which: the IC package is part of a reflectarray, the second array of IC dies comprises memory circuitry and digital circuitry, and the third array of IC dies comprises circuitry to synchronize digital signals communicated between IC dies in the first array.

Example 17 provides the IC package of any of examples 6-16, in which the interconnects comprise at least one of: hybrid bonds, solder-based bonds, and anisotropic conductive adhesive.

Example 18 provides a method comprising: forming a first layer having a first plurality of IC dies surrounded by dielectric; forming a second layer over the first layer, the second layer comprising a second plurality of IC dies surrounded by dielectric; and forming a third layer over the second layer, comprising attaching a third plurality of IC dies having RF patch antennas on a side opposite to the second layer.

Example 19 provides the method of example 18, further comprising forming a superstrate over the third layer, in which forming the superstrate comprises: depositing the dielectric over the third layer, etching the dielectric using lithography to form RF antenna structures and vias in the dielectric.

Example 20 provides the method of example 18, further comprising attaching a pre-made superstrate to the third layer using one of: hybrid bonding with silicon-level interconnect density, solder bonding, and anisotropic conductive adhesive bonding.

Example 21 provides a microelectronic assembly comprising: a first plurality of IC dies in a first layer; a second plurality of IC dies in a second layer between the first layer and a third layer; and a third plurality of IC dies in the third layer, in which: a portion of the first plurality of IC dies comprises RF patch antennas on a side opposite to the second layer, and an interface between adjacent layers comprises DTD interconnects.

Example 22 provides the microelectronic assembly of example 21, in which the RF patch antennas are arranged in an array.

Example 23 provides the microelectronic assembly of any of examples 21-22, in which the RF patch antennas radiate millimeter wavelength RF waves.

Example 24 provides the microelectronic assembly of any of examples 21-23, in which the first plurality of IC dies is arranged in an array.

Example 25 provides the microelectronic assembly of any of examples 21-24, in which at least one IC die in the portion comprises fewer RF patch antennas than another IC die in the portion.

Example 26 provides the microelectronic assembly of any of examples 21-25, in which another portion of the first plurality of IC dies does not comprise RF patch antennas on the side opposite to the second layer.

Example 27 provides the microelectronic assembly of example 26, in which the another portion comprises one of memory, security, and configuration circuitry.

Example 28 provides the microelectronic assembly of any of examples 21-27, in which the second plurality of IC dies comprises bridge dies to electrically couple adjacent IC dies in the first plurality of IC dies.

Example 29 provides the microelectronic assembly of example 28, in which the second plurality of IC dies comprises circuitry to synchronize signals communicated between IC dies in the first plurality of IC dies.

Example 30 provides the microelectronic assembly of any of examples 21-29, in which the second layer comprises dielectric having TDVs surrounding the second plurality of IC dies.

Example 31 provides the microelectronic assembly of any of examples 21-30, in which the third plurality of IC dies comprises baseband circuitry.

Example 32 provides the microelectronic assembly of any of examples 21-31, in which IC dies in the portion are fabricated using materials and processes based on RF functionalities of the IC dies.

Example 33 provides the microelectronic assembly of example 32, in which IC dies in the portion comprise one of a compound of gallium and nitrogen, a compound of gallium and arsenic, a compound of indium and phosphorus, and a compound of indium, gallium, and arsenic.

Example 34 provides the microelectronic assembly of any of examples 21-33, in which the third plurality of IC dies is fabricated using materials and processes based on baseband functionalities of respective IC dies.

Example 35 provides the microelectronic assembly of any of examples 21-34, in which the third plurality of IC dies is fabricated using beyond complementary metal-oxide semiconductor (beyond-CMOS) process.

Example 36 provides the microelectronic assembly of any of examples 21-35, in which the third layer is coupled to a package substrate.

Example 37 provides the microelectronic assembly of any of examples 21-36, in which the microelectronic assembly is part of a imaging and sensing system.

Example 38 provides the microelectronic assembly of any of examples 21-37, in which the interconnects comprise hybrid bonds, including metal-to-metal bonds and oxide-to-oxide bonds.

Example 39 provides the microelectronic assembly of any of examples 21-37, in which the interconnects comprise anisotropic conductive adhesive.

Example 40 provides the microelectronic assembly of any of examples 21-37, in which the interconnects comprise solder-based bonds.

Example 41 provides a microelectronic assembly comprising: a superstrate in a first layer; a first IC die comprising RF patch antennas in a second layer coupled to the first layer; a second IC die in a third layer between the second layer and a fourth layer; and a third IC die in the fourth layer, in which: one of the second IC die and the third IC die comprises baseband circuitry, the other of the second IC die and the third IC die comprises at least one of memory circuitry and microcontroller circuitry, and an interface between any two adjacent layers comprises DTD interconnects.

Example 42 provides the microelectronic assembly of example 41, in which the superstrate comprises one of glass, silicon, alumina, and high-resistivity silicon.

Example 43 provides the microelectronic assembly of any of examples 41-42, in which the superstrate comprises shielding vias between adjacent RF patch antennas.

Example 44 provides the microelectronic assembly of any of examples 41-43, further comprising a stacked patch antenna over the superstrate, in which the stacked patch antenna comprises a plurality of layers of antenna.

Example 45 provides the microelectronic assembly of any of examples 41-44, in which the baseband circuitry is made using an analog-optimized process.

Example 46 provides the microelectronic assembly of any of examples 41-45, in which the baseband circuitry comprises a digital-to-analog converter, an analog-to-digital converter, and a local oscillator.

Example 47 provides the microelectronic assembly of any of examples 41-46, in which the at least one of memory circuitry and microcontroller circuitry is made using a process for low-power operation with high-area efficiency.

Example 48 provides the microelectronic assembly of any of examples 41-47, in which the first IC die, the second IC die and the third IC die comprise TSVs.

Example 49 provides the microelectronic assembly of any of examples 41-48, further comprising a fourth IC die in a fifth layer, in which the fifth layer couples the microelectronic assembly to a package substrate.

Example 50 provides the microelectronic assembly of example 49, in which: the fifth layer is between the fourth layer and the package substrate, and the fourth IC die couples two adjacent IC dies in the fourth layer.

Example 51 provides the microelectronic assembly of any of examples 49-50, in which: the superstrate, the first IC die, the second IC die and the third IC die comprise a unit, the microelectronic assembly further comprises another unit, and the unit and another unit are electrically coupled by the fourth IC die.

Example 52 provides the microelectronic assembly of any of examples 49-51, in which the fifth layer comprises dielectric with TDVs surrounding the fourth IC die.

Example 53 provides the microelectronic assembly of example 41, in which: the superstrate and the first IC die comprise a unit, the microelectronic assembly further comprises another unit, and the unit and another unit are electrically coupled to the second IC die in the third layer.

Example 54 provides the microelectronic assembly of any of examples 41-53, in which the first IC die comprises one of a compound of gallium and nitrogen, a compound of gallium and arsenic, a compound of indium and phosphorus, and a compound of indium, gallium, and arsenic.

Example 55 provides the microelectronic assembly of any of examples 41-54, in which the microelectronic assembly is part of a communication relay device.

Example 56 provides the microelectronic assembly of any of examples 41-55, in which the interconnects comprise hybrid bonds, including metal-to-metal bonds and oxide-to-oxide bonds.

Example 57 provides the microelectronic assembly of any of examples 41-55, in which the interconnects comprise anisotropic conductive adhesive.

Example 58 provides the microelectronic assembly of any of examples 41-55, in which the interconnects comprise solder-based bonds.

Example 59 provides a microelectronic assembly comprising: a superstrate in a first layer; a first IC die comprising RF patch antennas in a second layer between the first layer and a third layer; and a second IC die comprising memory circuitry and digital circuitry in the third layer, in which: an interface between any two adjacent layers comprises DTD interconnects.

Example 60 provides the microelectronic assembly of example 59, in which the microelectronic assembly is part of a reflectarray.

Example 61 provides the microelectronic assembly of any of examples 59-60, in which the support circuitry comprises phase shifting switches.

Example 62 provides the microelectronic assembly of any of examples 59-61, in which the superstrate comprises one of glass, silicon, alumina, and high-resistivity silicon.

Example 63 provides the microelectronic assembly of any of examples 59-62, in which the first IC die comprises a material suitable for low loss RF sub-terahertz switches.

Example 64 provides the microelectronic assembly of any of examples 59-63, in which a pitch between adjacent RF patch antennas is half a wavelength of the RF waves reflected by the RF patch antennas.

Example 65 provides the microelectronic assembly of any of examples 59-64, in which: the superstrate, the first IC die, and the second IC die comprise a unit, the microelectronic assembly further comprises another unit, and the unit and another unit are electrically coupled by a third IC die in a fourth layer.

Example 66 provides the microelectronic assembly of example 65, in which the fourth layer comprises dielectric with TDVs surrounding the third IC die.

Example 67 provides the microelectronic assembly of example 59, in which: the superstrate, and the first IC die comprise a unit, the microelectronic assembly further comprises another unit, and the unit and the another unit are coupled to the second IC die.

Example 68 provides the microelectronic assembly of any of examples 59-67, in which the interconnects comprise hybrid bonds, including metal-to-metal bonds and oxide-to-oxide bonds.

Example 69 provides the microelectronic assembly of any of examples 59-67, in which the interconnects comprise anisotropic conductive adhesive.

Example 70 provides the microelectronic assembly of any of examples 59-67, in which the interconnects comprise solder-based interconnects.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
   a first die in a first layer, the first layer comprising an array of patch antennas on a side opposite to a second layer;
   a second die in the second layer between the first layer and a third layer; and
   a third die in the third layer, wherein:
   the first die comprises circuitry,
   the second layer and the third layer comprise a dielectric with through-dielectric vias (TDVs) therein surrounding the second die and the third die, respectively, and
   an interface between adjacent layers comprises interconnects having a pitch of less than 10 micrometers between adjacent ones of the interconnects.

2. The microelectronic assembly of claim 1, wherein:
   the first die is part of an array of dies,
   the second die is to electrically couple the first die with an adjacent die in the array, and
   the third die comprises additional circuitry.

3. The microelectronic assembly of claim 1, wherein the dielectric is a first dielectric, and the microelectronic assembly further comprises:
   a dielectric layer comprising a second dielectric over the patch antennas; and
   a fourth die in a fourth layer, wherein:
   the dielectric layer is adjacent and parallel to the first layer,
   one of the second die and the third die comprises baseband circuitry,
   another one of the second die and the third die comprises at least one of memory circuitry and microcontroller circuitry, and
   the fourth die is to electrically couple adjacent dies in the third layer.

4. The microelectronic assembly of claim 1, wherein the dielectric is a first dielectric, and the microelectronic assembly further comprises:
   a dielectric layer comprising a second dielectric over the patch antennas, wherein:
   the dielectric layer is adjacent and parallel to the first layer,
   the second die comprises memory and digital circuits, and
   the third die is to electrically couple adjacent dies in the second layer.

5. The microelectronic assembly of claim 1, wherein the interconnects comprise at least one of: hybrid bonds, solder-based bonds, and anisotropic conductive adhesive.

6. An integrated circuit (IC) package, comprising:
   a first array of IC dies in a first layer, the first array of IC dies comprising an array of metal patches on a side opposite to a second layer;
   a second array of IC dies in the second layer between the first layer and a third layer; and
   a third array of IC dies in the third layer, wherein:
   the first array comprises radio frequency (RF) and analog circuitry,
   the IC dies in the first array, the second array and the third array comprise through-substrate vias (TSVs), and
   an interface between adjacent layers comprises interconnects having a pitch of 10 micrometers between adjacent ones of the interconnects.

7. The IC package of claim 6, wherein a pitch of the array of metal patches is about half a wavelength of RF waves to be operated on by the metal patches.

8. The IC package of claim 6, wherein the second layer and the third layer comprise dielectric with TDVs therein.

9. The IC package of claim 6, wherein:
   the second array of IC dies comprises circuitry to synchronize digital signals communicated between IC dies in the first array, and
   the third array of IC dies comprises baseband circuitry.

10. The IC package of claim 6, further comprising a dielectric layer over the metal patches, adjacent and parallel to the first layer.

11. The IC package of claim 10, wherein the dielectric layer comprises separate units of dielectric material spanning individual IC dies in the first array.

12. The IC package of claim 10, wherein the dielectric layer comprises a single unit of dielectric material spanning the first array of IC dies.

13. The IC package of claim 6, wherein an individual metal patch of the metal patches is part of a multi-layer stacked antenna.

14. The IC package of claim 6, wherein:
the IC package comprises a communication relay device,
one of the second array of IC dies and the third array of IC dies comprises baseband circuitry, and
another one of the second array of IC dies and the third array of IC dies comprises at least one of memory circuitry and microcontroller circuitry.

15. The IC package of claim 14, further comprising a fourth array of IC dies in a fourth layer, wherein the fourth array of IC dies comprises circuitry to synchronize digital signals communicated between IC dies in the first array.

16. The IC package of claim 6, wherein:
the IC package comprises a reflectarray,
the second array of IC dies comprises memory circuitry and digital circuitry, and
the third array of IC dies comprises circuitry to synchronize digital signals communicated between IC dies in the first array.

17. The IC package of claim 6, wherein the interconnects comprise one or more of: a hybrid bond, a solder-based bond, and an anisotropic conductive adhesive.

18. A microelectronic assembly, comprising:
a first IC die in a first layer, the first layer comprising an array of patch antennas on a side opposite to a second layer, wherein an individual patch antenna includes a stack of vertically stacked sublayers within the first layer, the sublayers separated from one another by a first dielectric and comprising a sublayer comprising a ground plane, a sublayer comprising a first metal patch, and a sublayer comprising a second metal patch;
a second IC die in the second layer between the first layer and a third layer; and
a third IC die in the third layer, wherein:
the first IC die is part of an array of IC dies in the first layer,
the second layer includes a second dielectric with through-dielectric vias (TDVs) surrounding the second IC die,
the third layer includes a third dielectric with TDVs, and
an interface between adjacent layers comprises interconnects having a pitch equal to or smaller than 10 micrometers between adjacent ones of the interconnects.

19. The microelectronic assembly of claim 18, wherein the sublayers further include a sublayer comprising a slot.

20. The microelectronic assembly of claim 19, wherein the sublayer comprising the slot further includes a conductive line.

* * * * *